(12) United States Patent
Söderlund et al.

(10) Patent No.: US 12,421,596 B2
(45) Date of Patent: Sep. 23, 2025

(54) METHOD AND APPARATUS FOR PROCESSING SURFACE OF A SEMICONDUCTOR SUBSTRATE

(71) Applicant: BENEQ OY, Espoo (FI)

(72) Inventors: Mikko Söderlund, Espoo (FI); Pasi Meriläinen, Espoo (FI); Patrick Rabinzohn, Espoo (FI); Markus Bosund, Espoo (FI)

(73) Assignee: BENEQ OY, Espoo (FI)

( * ) Notice: Subject to any disclaimer, the term of this patent is extended or adjusted under 35 U.S.C. 154(b) by 245 days.

(21) Appl. No.: 17/763,672

(22) PCT Filed: Sep. 24, 2020

(86) PCT No.: PCT/FI2020/050626
§ 371 (c)(1),
(2) Date: Mar. 25, 2022

(87) PCT Pub. No.: WO2021/058872
PCT Pub. Date: Apr. 1, 2021

(65) Prior Publication Data
US 2022/0356561 A1    Nov. 10, 2022

(30) Foreign Application Priority Data
Sep. 25, 2019  (FI) ..................................... 20195816

(51) Int. Cl.
*C23C 14/56* (2006.01)
*C23C 16/455* (2006.01)
(Continued)

(52) U.S. Cl.
CPC ........ *C23C 14/56* (2013.01); *C23C 16/45538* (2013.01); *H01J 37/32568* (2013.01); *H01L 21/67161* (2013.01)

(58) Field of Classification Search
CPC .............. C23C 14/56; C23C 16/45538; C23C 16/0245; C23C 16/34; C23C 16/403;
(Continued)

(56) References Cited

U.S. PATENT DOCUMENTS 9,824,884 B1    11/2017  Sims
10,079,178 B1 *  9/2018  Chen ..................... H01L 21/768
(Continued)

FOREIGN PATENT DOCUMENTS

EP    1746182 A2    1/2007
JP    2006511934 A    4/2006
(Continued)

OTHER PUBLICATIONS

Japanese Office Action dated May 30, 2023, issued in corresponding JP Appln. No. 2022-519082 (4 pages), and English translation (3 pages), total 7 pages.
(Continued)

*Primary Examiner* — Binh X Tran
(74) *Attorney, Agent, or Firm* — CARTER, DELUCA & FARRELL LLP

(57) ABSTRACT

A method and apparatus for processing a surface of a substrate with a cluster apparatus including a transport chamber and two or more process reactors connected to the transport chamber. The method further includes subjecting the surface of the substrate to a surface preparation step for providing a prepared substrate surface, providing an interface layer on the prepared substrate surface of the substrate for forming an interfaced substrate surface, and providing a functional layer on the interfaced substrate surface of the substrate. The process steps are carried out in at least two different process reactors connected to transport chamber the
(Continued)

substrate is transported between the at least two process reactors via the transport chamber under vacuum atmosphere.

19 Claims, 22 Drawing Sheets

(51) Int. Cl.
   *H01J 37/32* (2006.01)
   *H01L 21/67* (2006.01)
(58) Field of Classification Search
   CPC .......... C23C 16/45536; C23C 16/0272; C23C 14/568; C23C 16/45544; C23C 16/54; C23C 16/45551; C23C 16/545; C23C 16/4412; C23C 16/4401; H01J 37/32568; H01L 21/67161; H01L 21/0226; H01L 21/67155; H01L 21/67739; H01L 21/67167; H01L 21/6719; H01L 21/67196; H01L 21/67201; H01L 21/67173; H01L 21/67184; H01L 21/6776; H01L 21/67017; H01L 21/67069; H01L 21/67748; H01L 21/67751; H01L 21/67745
   USPC .................. 118/719; 156/345.31, 345.32
   See application file for complete search history.

(56) References Cited

U.S. PATENT DOCUMENTS

| | | | |
|---|---|---|---|
| 2001/0007246 A1* | 7/2001 | Ueda | C23C 16/54 |
| | | | 118/724 |
| 2008/0057221 A1 | 3/2008 | Boyd et al. | |
| 2008/0124484 A1* | 5/2008 | Shinriki | C23C 16/0281 |
| | | | 427/535 |
| 2012/0210937 A1* | 8/2012 | Thakur | C23C 16/54 |
| | | | 118/725 |
| 2013/0115763 A1 | 5/2013 | Takamure et al. | |
| 2015/0348773 A1 | 12/2015 | Zhu et al. | |
| 2017/0350004 A1 | 12/2017 | Kaufman-Osborn et al. | |
| 2018/0155834 A1 | 6/2018 | Mukund et al. | |
| 2018/0211833 A1 | 7/2018 | Li et al. | |
| 2019/0194809 A1 | 6/2019 | Holm et al. | |
| 2020/0095674 A1* | 3/2020 | Saly | C23C 16/4584 |
| 2021/0116772 A1* | 4/2021 | Callens | G02F 1/1677 |
| 2022/0013365 A1* | 1/2022 | van Cleemput | H01L 23/53257 |

FOREIGN PATENT DOCUMENTS

| | | |
|---|---|---|
| JP | 200788401 A | 4/2007 |
| JP | 2018166223 A | 10/2018 |
| KR | 20090035578 A | 4/2009 |
| KR | 20150022006 A | 3/2015 |
| KR | 20170137653 A | 12/2017 |
| KR | 20190049838 A | 5/2019 |
| WO | 2006055984 A2 | 5/2006 |
| WO | 2008005773 A2 | 1/2008 |
| WO | 2006137287 A1 | 1/2009 |
| WO | 2019170252 A1 | 9/2019 |

OTHER PUBLICATIONS

Supplementary European Search Report dated Nov. 29, 2022, issued in corresponding EP Appln. No. 20769394, 4 pages.
International Search Report issued by the Finnish Patent and Registration Office actng as the International Searching Authority in relation to International Application No. PCT/FI2020-050626 dated Dec. 22, 2020 (5 pages).
Written Opinion of the International Searching Authority issued by the Finnish Patent and Registration Office actng as the International Searching Authority in relation to International Application No. PCT/FI2020-050626 dated Dec. 22, 2020 (6 pages).
Finnish Search Report issued by the Finnish Patent and Registration Office in relation to Finnish Application No. 20195816 dated Apr. 20, 2020 (2 pages).
Written Opinion for Korean Application No. 10-20 2 2-70 13 5 96, Apr. 1, 2024 (5 pages), and English Translation (7 pages), total 12 pages.

* cited by examiner

METHOD AND APPARATUS FOR PROCESSING SURFACE OF A SEMICONDUCTOR SUBSTRATE

CROSS-REFERENCE TO RELATED APPLICATIONS

This application is a national phase entry under 35 U.S.C. 371 of PCT International Application No. PCT/2020/050626 filed Sep. 24, 2020, which claims priority to Finnish Patent Application No. 20195816, filed Sep. 25, 2019, the disclosure of each of these applications is expressly incorporated herein by reference in their entirety.

FIELD OF THE INVENTION

The present invention relates to a method for processing a surface of a semiconductor substrate. The present invention further relates to a cluster apparatus for processing a surface of a semiconductor substrate.

BACKGROUND OF THE INVENTION

Various substrates are processed for providing different kinds functional properties for the substrates. For example, in semiconductor industry silicon wafers are subjected to complicated processes for providing desired functional properties for the silicon substrates or surface(s) of the substrates. Similar complicated processes are carried out also for other kinds of substrates.

Often these kinds of substrates are manufactured for high technology purposes and quality of the functional properties or substrate surfaces with functional layers or coatings is essential.

For achieving necessary high quality functional surface for the substrate, the surface is first treated with surface preparation process. The surface preparation process step comprises at least cleaning the surface of the substrate. After the cleaning, the surface of the substrate is subjected to interface step in which an interface material layer is provided on the surface of the substrate. The interface layer serves a base for a subsequent functional layer or layers or functional coating. Thus, after the interface step, the functional material layer is provided on the surface of the substrate and on the interface material layer.

In prior art methods for providing the substrate surface with the functional layer the surface preparation process step, the interface step and the step for providing the functional material layer are all carried out as separate process steps in individual process devices, meaning stand alone devices. Furthermore, each process step is carried out to a single substrate at a time. All this is done for achieving highest possible quality for the substrate and the functional coating on it. The substrates transported from one process device to another between the process steps.

As usual, the high quality and industrial efficiency of the method is trade off. Increasing production or process efficiency decreases the quality of the end product. Therefore, processing more than one substrate at a time in a same process device could increase the productivity of the method. However, at the same time the quality of the end product, the substrate with the functional layer would decrease and also considerably more complicated process device should be used. The decreased quality a consequence of the sensibility of the substrates, for example semiconductor wafers. When the substrates are processed in process devices they are in closed and controlled vacuum atmosphere. However, when the substrates are transported from one process device to another between the process steps, the substrate and surfaces thereof are subjected to contamination from ambient atmosphere. The substrates usually extremely sensitive to contamination and even small contamination may deteriorate the functional layer and the properties of the functional layer. When more than substrate is processed in one process at a time, the time during which the substrates are subjected to contamination increases as transporting several substrates takes longer time during which the substrates are subjected to contamination.

BRIEF DESCRIPTION OF THE INVENTION

An object of the present invention is to provide a method and apparatus so as to overcome or at least alleviate the prior art disadvantages.

The preferred embodiments of the invention are disclosed in the dependent claims.

The invention is based on the idea of providing method for processing surface of a substrate, the method being carried out with a cluster apparatus comprising a transport chamber and two or more process reactors connected to the transport chamber. The method comprises providing vacuum atmosphere to the transport chamber and the method further comprises the following processing steps carried out successively:
  a) subjecting the surface of the substrate to a surface preparation step for providing a prepared substrate surface;
  b) providing an interface layer on the prepared substrate surface of the substrate for forming an interfaced substrate surface; and
  c) providing a functional layer or layers on the interfaced substrate surface of the substrate for providing a functionally coated substrate.

According to the present invention the step a) comprises pre-cleaning the surface of the substrate by utilizing plasma treatment on the surface of the substrate for providing the prepared substrate surface. Further, the step b) comprises depositing the interface layer on the prepared substrate surface by utilizing plasma enhanced deposition method for providing the interfaced substrate layer, and the step c) comprises depositing the functional layer on the interfaced substrate surface by utilizing atomic layer deposition method for providing the functionally coated substrate surface. The method of the present invention further comprises carrying the processing steps a), b) and c) in at least two different process reactors connected to transport chamber, and transporting the substrate between the at least two process reactors via the transport chamber under vacuum atmosphere.

Accordingly, the plasma treated pre-cleaned, or prepared, substrate surface from step a) is processed in step b) with plasma enhanced deposition method for providing the interfaced substrate layer. Then, the plasma treated pre-cleaned, or prepared, substrate provided with the interfaced substrate layer by plasma enhanced deposition method is processed in step c) by depositing the functional layer by utilizing atomic layer deposition method.

Accordingly, the substrates are transported between the different process reactors in vacuum atmosphere. Thus, the substrates are not subjected to contamination during the transport between the process reactors and process steps. Further, all the steps a), b) and c) may be carried out such that the substrates are kept under vacuum atmosphere from beginning of step a) to the end of step c).

Plasma treatment is efficient for pre-cleaning the surface of the substrate.

In the context of this application atomic layer deposition means cyclical deposition method in which surface of a substrate is subjected successively to alternating surface reaction of at least a first and second precursors. Thus, atomic layer deposition may mean pure atomic layer deposition comprising saturated surfaces reaction of the at least first and second precursors. Alternatively, atomic layer deposition may comprise under dosing such that at least one of the precursors such that whole surface of the substrate is not subjected to saturated surface reactions, or over dosing such that a part of the reactions of the at least first and second substrate occur in gas phase over the surface of the substrate.

In one embodiment, the method comprises carrying out step a) in a first process reactor, transporting the substrate after step a) from the first process reactor to a second process reactor via the transport chamber under vacuum atmosphere, and carrying out steps b) and c) in the second process reactor. Thus, both substrate coating steps are provided in a same second process reactor.

In another embodiment, the method comprises carrying out steps a) and b) in a first process reactor, transporting the substrate after step b) from the first process reactor to a second process reactor via the transport chamber under vacuum atmosphere and carrying out steps c) in the second process reactor. Both the preliminary process steps are carried out in the same first process reactor and then the final functional layer is provided in the second reactor.

In the above embodiment, the efficiency is increased by utilizing only two different process reactors and thus substrate is transported only once between process reactors.

In a further embodiment, the method comprises carrying out step a) in a first process reactor, transporting the substrate after step a) from the first process reactor to a second process reactor via the transport chamber under vacuum atmosphere, carrying out step b) in the second process reactor, transporting the substrate after step b) from the second process reactor to a third process reactor via the transport chamber under vacuum atmosphere, and carrying out steps c) in the third process reactor. All the process steps are carried in different reactors enabling utilizing specialized process reactors for each process step.

In one embodiment of the present invention, the method comprises carrying out steps a) and b) in a single substrate reactor and carrying out step c) in a batch process reactor. Accordingly, for example two single substrate reactors may be utilized together with one batch process reactor for increasing efficiency of the process.

In another embodiment, the method comprises carrying out steps a) in a first single substrate reactor, carrying out step b) in a second single substrate reactor and carrying out step c) in a batch process reactor. Specialized first and second reactors may be used for the steps a) and b).

In a further embodiment, the method comprises carrying out steps a), b) and a first portion of step c) in a single substrate reactor and carrying out a second portion of step c) in a batch process reactor. Thus, two parallel single substrate reactors may be utilized together with the batch process reactor. Further, the functional layer produced in step c) is usually not so prone to reactions and contamination. Thus, it is advantageous to provide even small portion of the functional layer on the interface layer before transporting the substrate. The interface layer is considerably more sensitive.

In a yet alternative embodiment, the method comprises carrying out steps a) in a first single substrate reactor, carrying out step b) in a second single substrate reactor, carrying out a first portion of step c) in the second single substrate reactor and carrying out a second portion of step c) in a batch process reactor. The above mentioned applies also to this embodiment together that a specialized first single substrate reactor may be used for step a).

In the context of this application, the first portion of the functional layer has a thickness of 1 to 10 nm. Accordingly, carrying out the first portion of step c) comprises proving on the interfaced substrate surface the first portion of the functional layer with thickness of 1 to 10 nm. Further, the second portion of the functional layer has a thickness at least 5 nm. Accordingly, carrying out the second portion of step c) comprises providing on the interfaced substrate surface the second portion of the functional layer with thickness of 5 nm or more.

Further in the one embodiment of the present invention, the first portion of the functional layer has a thickness of 1 to 10 nm. Accordingly, carrying out the first portion of step c) comprises proving on the interfaced substrate surface the first portion of the functional layer with thickness of 1 to 10 nm. Further, the second portion of the functional layer has a thickness greater than the thickness of the first portion of the functional layer. Accordingly, carrying out the second portion of step c) comprises providing on the interfaced substrate surface the second portion of the functional layer with thickness greater than the thickness of the first layer.

In the context of this application, the first portion of the functional layer has a thickness of 1 to 10 nm. Accordingly, carrying out the first portion of step c) comprises proving on the interfaced substrate surface the first portion of the functional layer with thickness of 1 to 10 nm. Further, the second portion of the functional layer has a thickness between 10 to 1000 nm, or preferably between 10 to 300 nm, or more preferably between 20 to 50 nm. Accordingly, carrying out the second portion of step c) comprises providing on the interfaced substrate surface the second portion of the functional layer with thickness between 10 to 1000 nm, or preferably between 10 to 300 nm, or more preferably between 20 to 50 nm.

The above mentioned thicknesses of the first and second portion functional layer apply for all embodiments of the invention in which the first and second portion of the functional layer are provided separately.

In one embodiment, the method comprises carrying out step a) in the single substrate reactor, transporting the substrate after step a) from the first single substrate reactor to the second single substrate reactor via the transport chamber under vacuum atmosphere, and carrying out steps b) and c) in the second single substrate reactor. A deposition reactor is utilized for the steps b) and c) and step a) id carried out in specialized cleaning or preparation reactor.

In another embodiment, the method comprises carrying out steps a) and b) in the first single substrate reactor, transporting the substrate after step b) from the first single substrate reactor to the second single substrate reactor via the transport chamber under vacuum atmosphere, and carrying out steps c) in the second single substrate reactor. Thus, transporting the substrates between the process reactors is minimized.

In a further embodiment, the method comprises carrying out step a) in the first single substrate reactor, transporting the substrate after step a) from the first single substrate reactor to the second single substrate reactor via the transport chamber under vacuum atmosphere, carrying out step b) in the second single substrate reactor, transporting the substrate after step b) from the second single substrate reactor to a third single substrate reactor via the transport chamber under vacuum atmosphere, and carrying out step c) in the third single substrate reactor. Thus, a specialized singe substrate reactor may be used for each process step.

In one embodiment, the method comprises carrying out steps a) and b) in the first single substrate reactor, transporting the substrate after step b) from the first single substrate reactor to the first batch process reactor via the transport chamber under vacuum atmosphere, and carrying out steps c) in the first batch process reactor. Thus, the batch reactor is used for providing the functional layer on two or more substrates simultaneously for increasing efficiency. Thus, two or more single substrates reactor may be used in the same cluster apparatus for carrying out steps a) and b) simultaneously.

In another embodiment, the method comprises carrying out steps a) and b) in the first single substrate reactor, carrying out the first portion of step c) in the first single substrate reactor for providing the first portion of the functional layer on the interfaced substrate surface, transporting the substrate after the first portion of step c) from the first single substrate reactor to the first batch process reactor via the transport chamber under vacuum atmosphere, and carrying out the second portion of step c) in the first batch process reactor for providing the second portion of the functional layer on the first portion of the functional layer. Thus, the interface layer may be protected with small functional layer before transporting the substrate to the batch reactor.

In one embodiment, the method comprises carrying out step a) in the first single substrate reactor, transporting the substrate after step a) from the first single substrate reactor to the second single substrate reactor via the transport chamber under vacuum atmosphere, carrying out step b) in the second single substrate reactor, transporting the substrate after step b) from the second single substrate reactor to the first batch process reactor via the transport chamber under vacuum atmosphere, and carrying out step c) in the first batch process reactor.

In an alternative embodiment, the method comprises carrying out step a) in the first single substrate reactor, transporting the substrate after step a) from the first single substrate reactor to the second single substrate reactor via the transport chamber under vacuum atmosphere, carrying out step b) in the second single substrate reactor, carrying out the first portion of step c) in the second single substrate reactor for providing the first portion of the functional layer on the interfaced substrate surface, transporting the substrate after the first portion of step c) from the second single substrate reactor to the first batch process reactor via the transport chamber under vacuum atmosphere, and carrying out the second portion of step c) in the first batch process reactor.

In one embodiment, the method comprises carrying out step a) in a first batch process reactor, transporting the substrate after step a) from the first batch process reactor to a first single substrate reactor via the transport chamber under vacuum atmosphere, and carrying out steps b) and c) in the first single substrate reactor. This enables carrying out the step a) for two or more substrates at the same time.

In one embodiment, the method comprises carrying out step a) in a first batch process reactor, transporting the substrate after step a) from the first batch process reactor to a first single substrate reactor via the transport chamber under vacuum atmosphere, carrying out step b) in the first single substrate reactor, transporting the substrate after step b) from the first single substrate reactor to a second single substrate reactor via the transport chamber under vacuum atmosphere, and carrying out step c) in the second single substrate reactor.

In another embodiment, the method comprises carrying out step a) in a first batch process reactor, transporting the substrate after step a) from the first batch process reactor to a first single substrate reactor via the transport chamber under vacuum atmosphere, carrying out step b) in the first single substrate reactor, carrying out the first portion of step c) in the first single substrate reactor for providing the first portion of the functional layer on the interfaced substrate surface, transporting the substrate after the first portion of step c) from the first single substrate reactor to a second single substrate reactor via the transport chamber under vacuum atmosphere, and carrying out the second portion of step c) in the second single substrate reactor.

In one embodiment, the method comprises carrying out step a) in a first batch process reactor, transporting the substrate after step a) from the first batch process reactor to a first single substrate reactor via the transport chamber under vacuum atmosphere, carrying out step b) in the first single substrate reactor, transporting the substrate after step b) from the first single substrate reactor to a second batch process reactor via the transport chamber under vacuum atmosphere, and carrying out step c) in the second batch process reactor. This enables carrying out the steps a) and c) for two or more substrates at the same time for increasing efficiency of the method.

In an alternative embodiment, the method comprises carrying out step a) in a first batch process reactor, transporting the substrate after step a) from the first batch process reactor to a first single substrate reactor via the transport chamber under vacuum atmosphere, carrying out step b) in the first single substrate reactor, carrying out the first portion of step c) in the first single substrate reactor for providing the first portion of the functional layer on the interfaced substrate surface, transporting the substrate after the first portion of step c) from the first single substrate reactor to a second batch process reactor via the transport chamber under vacuum atmosphere, and carrying out the second portion of step c) in the second batch process reactor.

In the embodiments utilizing a batch process reactor, the step c) comprises providing the functional layer or the second portion of the functional layer to two or more substrates simultaneously in the first batch process reactor. Batch process reactor is arranged to receive and process two or more substrates at the same time. This increases the efficiency of the method without subjecting the substrates to contamination due to the vacuum atmosphere in the transport chamber.

Further, in step a) utilizing a batch process reactor, the method comprises in step a) subjecting the surface of two or more substrates simultaneously to the surface preparation step in the first batch process reactor.

Alternatively, when the steps a) and c) are carried out in batch process reactors, the method comprises in step a) subjecting the surface of two or more substrates simultaneously to the surface preparation step in the first batch process reactor, and in step c) providing the functional layer or the second portion of the functional layer to two or more substrates simultaneously in the second batch process reactor.

The batch process reactor may be used in step a) when the surface preparation or pre-cleaning is carried out with gas phase processing without plasma.

In one embodiment, the step a) comprises pre-cleaning the surface of the substrate NH3-plasma processing for providing the prepared substrate surface. NH3-plasma treatment provides efficient surface preparation and cleaning of the surface of the substrate such that contaminations are removed and the surface prepared.

In a further embodiment, the step a) comprises pre-cleaning the surface of the substrate by plasma processing utilizing $N_2$-plasma, $O_2$-plasma, Ar-plasma, $H_2$-plasma, CO-plasma, $CO_2$-plasma or a mixture thereof for providing the prepared substrate surface. Thus, plasma processing is utilized for surface preparation for providing the prepared substrate surface.

Plasma processing in carried out in a single substrate reactor where plasma electrodes are provided and utilized for generating plasma. This provides high quality surface preparation.

In one embodiment, the step b) comprises depositing the interface layer on the prepared substrate surface for providing the interfaced substrate layer. The interface layer is deposited on the prepared substrate surface with a deposition method. Interface layer may be for example AlN-layer (aluminium nitride layer). The deposition method may be atomic layer deposition method or plasma enhanced atomic layer deposition method.

Instead of AlN-layer, an interface layer of $SiO_2$ (silicon dioxide), $Si_3N_4$ (silicon nitride), $Al_2O_3$ (aluminium oxide), TiN (titanium nitride), WN (tungsten nitride), $HfO_2$ (hafnium dioxide), $ZrO_2$ (zirconium dioxide), SiC (silicon carbide), SiCN (silicon carbon nitride), TaC (tantalum carbide) or TiC (titanium carbide) or the like may be provided as the interface layer by utilizing atomic layer deposition method or plasma enhanced atomic layer deposition method.

The interface layer is provided also for increasing adhesion of the subsequent functional layer. Further, the interface layer is provided for removing or controlling electron interface states by removing native oxide. Furthermore, the interface layer provides a controlled surface chemical termination for the subsequent functional layer.

The step b) comprises depositing the interface layer on the on the prepared substrate surface by utilizing plasma enhanced deposition method for providing the interfaced substrate layer. Plasma enhanced deposition process enables lowering the process temperature.

In a further embodiment, the step b) comprises depositing an AlN-layer on the prepared substrate surface by utilizing plasma enhanced atomic layer deposition method for providing the interfaced substrate layer. Plasma enhanced deposition process enables lowering the ALD process temperature and increasing reactivity of the nitrogen precursor. ALD is preferable deposition method due to the conformality and uniformity of the produced layer, especially for semiconductor substrates having high quality standards.

In an alternative embodiment, the step b) comprises depositing an $SiO_2$-layer, $Si_3N_4$-layer, $Al_2O_3$-layer, TiN-layer, WN-layer, $HfO_2$-layer (hafnium dioxide layer), $ZrO_2$-layer (zirconium dioxide layer), SiC-layer (silicon carbide layer), SiCN-layer (silicon carbon nitride layer), TaC-layer (tantalum carbide layer) or TiC-layer (titanium carbide layer) on the prepared substrate surface by utilizing plasma enhanced atomic layer deposition method for providing the interfaced substrate layer.

In one embodiment, step c) comprises depositing the functional layer on the interfaced substrate surface by utilizing thermal atomic layer deposition method for providing the functionally coated substrate surface.

In a yet alternative embodiment, step c) comprises depositing the functional layer of oxide material on the interfaced substrate surface by utilizing atomic layer deposition method for providing the functionally coated substrate surface. Oxide material provides desirable passive coating.

In a yet alternative embodiment, step c) comprises depositing the functional layer of oxide or aluminium oxide material, such as $AL_2O_3$, on the interfaced substrate surface by utilizing atomic layer deposition method for providing the functionally coated substrate surface.

ALD is preferable deposition method due to the conformality and uniformity of the produced layer, especially for semiconductor substrates having high quality standards.

Aluminium oxide material, such as $Al_2O_3$, provides good passivation and wear-resistant properties. Further, $Al_2O_3$ provides high quality dielectric layer with high breakdown voltage and low leakage.

The step c) comprises providing a dielectric functional layer on the interfaced substrate surface. Thus, the functional characteristic of the functional layer is electrical dielectricity. The functional layer provide in the step c) is a dielectric layer.

In the context of this application the functional layer is a dielectric layer, passivation layer, encapsulation layer, conductor layer, chemical barrier layer or optical layer. Thus, the functional layer provides a certain functional characteristic for the substrate surface.

In one embodiments, the step c) comprises depositing a functional high-k dielectric layer of $Al_2O_3$, $HfO_2$, $TiO_2$ (titanium dioxide), AlN, $ZrO_2$, $Ta_2O_5$ (tantalum pentoxide) and/or stacks or laminates thereof on the interfaced substrate surface by utilizing atomic layer deposition method for providing the functionally coated substrate surface. The high-k dielectric layer has high dielectric constant.

In another embodiment, the step c) comprises depositing a functional passivation layer of $SiO_2$, $Al_2O_3$, SiN, AlN and/or stacks or laminates thereof on the interfaced substrate surface by utilizing atomic layer deposition method for providing the functionally coated substrate surface. The passivation layer provides passivated substrate surface.

In other embodiment, the step c) comprises depositing a functional encapsulation layer of $Al_2O_3$, $HfO_2$, $TiO_2$, AlN, $ZrO_2$, SiN, $Ta_2O_5$ and/or stacks or laminates thereof on the interfaced substrate surface by atomic layer deposition method for providing the functionally coated substrate surface.

In some other embodiment, the step c) comprises depositing a functional conductor layer of TiN, WN, Ru (ruthenium), Pt (platinum), Cu (copper) and/or stacks or laminates thereof on the interfaced substrate surface by utilizing atomic layer deposition method for providing the functionally coated substrate surface.

In further embodiment, the step c) comprises depositing a functional chemical barrier layer of $Al_2O_3$, $HfO_2$, $TiO_2$, AlN, $ZrO_2$, SiN, $Ta_2O_5$ and/or stacks or laminates thereof on the interfaced substrate surface by utilizing or atomic layer deposition method for providing the functionally coated substrate surface.

In yet another embodiment, the step c) comprises depositing a functional optical layer of $Al_2O_3$, $HfO_2$, $TiO_2$, SiN, $Ta_2O_5$ and/or stacks or laminates thereof on the interfaced substrate surface by utilizing atomic layer deposition method for providing the functionally coated substrate surface.

In one embodiment, the method is applied to a semiconductor substrate, compound semiconductor substrate, or group iii-v semiconductor substrate. The method is especially suitable for processing sensitive semiconductor substrates with high quality and higher productivity.

In some embodiment, the method is carried out with an apparatus as disclosed below.

The present invention is also based on the idea of providing a cluster apparatus for processing surface of a substrate. The cluster apparatus comprises a transport chamber, a vacuum device connected to the transport chamber for providing vacuum atmosphere inside the transport chamber, a transport robot arranged inside the transport chamber, and two or more process reactors connected to the transport chamber.

According to the present invention the two or more process chambers comprises a first single substrate process reactor arranged to receive one substrate, and a first batch process reactor arranged to receive two or more substrates. Thus, the cluster apparatus is arranged to process substrates on at a time in the first single substrate reactor and two or more at the same time in the batch process reactor. Thus, the overall process efficiency and flexibility of the cluster apparatus is increased.

According to the present invention, the first single substrate reactor is an atomic layer deposition reactor having a reaction chamber and comprises plasma electrodes arranged to generate plasma inside the reaction chamber. This enables carrying out both the steps a) and b) in the same single substrate reactor and then utilizing the batch process reactor for step c).

Further according to the present invention, the first batch reactor is an atomic layer deposition reactor having a reaction chamber and the substrate rack arranged to support two or more substrates. Thus, the batch process reactor may process several substrates at the same time.

In one embodiment, the two or more process chambers further comprise second single substrate reactor arranged to receive one substrate. This, increases the efficiency of the cluster apparatus such that for example in both the first and second single substrate reactors may be used for carrying out steps a) and b) and then substrates from the first and second single substrate reactors are transported to the batch process reactor to be processed together at the same time.

This is especially advantageous, since the step c) of forming the functional layer is slowest process step and takes considerably more time than the steps a) and b).

Thus, in preferred embodiment the cluster apparatus comprises two or more single substrate rectors and the batch process reactor.

However, the cluster apparatus may also comprise two or more batch process reactors and one or more, or two or more, single substrate reactors for each of the bath process reactors.

The first single substrate reactor comprises single substrate support arranged to support one substrate.

Further, the first single substrate reactor comprises single substrate support arranged to support one substrate, and the second single substrate reactor comprises single substrate support arranged to support one substrate.

In one embodiment, the two or more process chambers further comprise second batch process reactor arranged to receive two or more substrates.

The first batch process reactor comprises a substrate rack arranged to support two or more substrates.

Further, the first batch process reactor comprises a substrate rack arranged to support two or more substrates and the second batch process reactor comprises a substrate rack arranged to support two or more substrates.

In one embodiment, the second single substrate reactor is an atomic layer deposition reactor having a reaction chamber and comprises plasma electrodes arranged to generate plasma inside the reaction chamber. This enables efficient and flexible processing, as the steps a) and b) may be carried out same singe substrate reactor or successively in the first and second single substrate reactors.

In one embodiment, the second batch reactor is an atomic layer deposition reactor having a reaction chamber and the substrate rack arranged to support two or more substrates.

Alternatively, the second batch process reactor may be another gas deposition reactor such as chemical vapor deposition reactor.

It should be noted that the cluster apparatus comprise a vacuum device connected to the transport chamber for providing vacuum atmosphere inside the transport chamber.

The same vacuum device may be connected to the process reactors for providing vacuum atmosphere inside the process reactors. Alternatively, each or at least some of the process reactors comprise a separate reactor vacuum device.

Therefore, the substrates are maintained in vacuum atmosphere during the whole process.

The cluster apparatus comprises in some embodiment also a buffer chamber connected to the transport chamber for storing substrates in the cluster apparatus.

The steps a) and b) of the method according to the present invention are rather quick steps and take only short period of time. However, the step c) takes a lot longer time. Therefore, the buffer chamber may be used for storing substrates after steps a) and b), and possible after the first portion of step c), before carrying out step c) in the batch process reactor.

The present invention provides a method and apparatus in which the quality of the substrates and the resulting functional layer may be increased as the substrates is maintained in vacuum atmosphere and conditions during the whole process from the beginning of step a) and the end of step c). Additionally, the process efficiency is increased due to utilizing cluster apparatus and separate reactors provided to the cluster apparatus. The batch processing is utilized even more increasing the efficiency in combination with the single substrate processing. Thus, the present invention achieves increased quality together with higher process efficiency.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
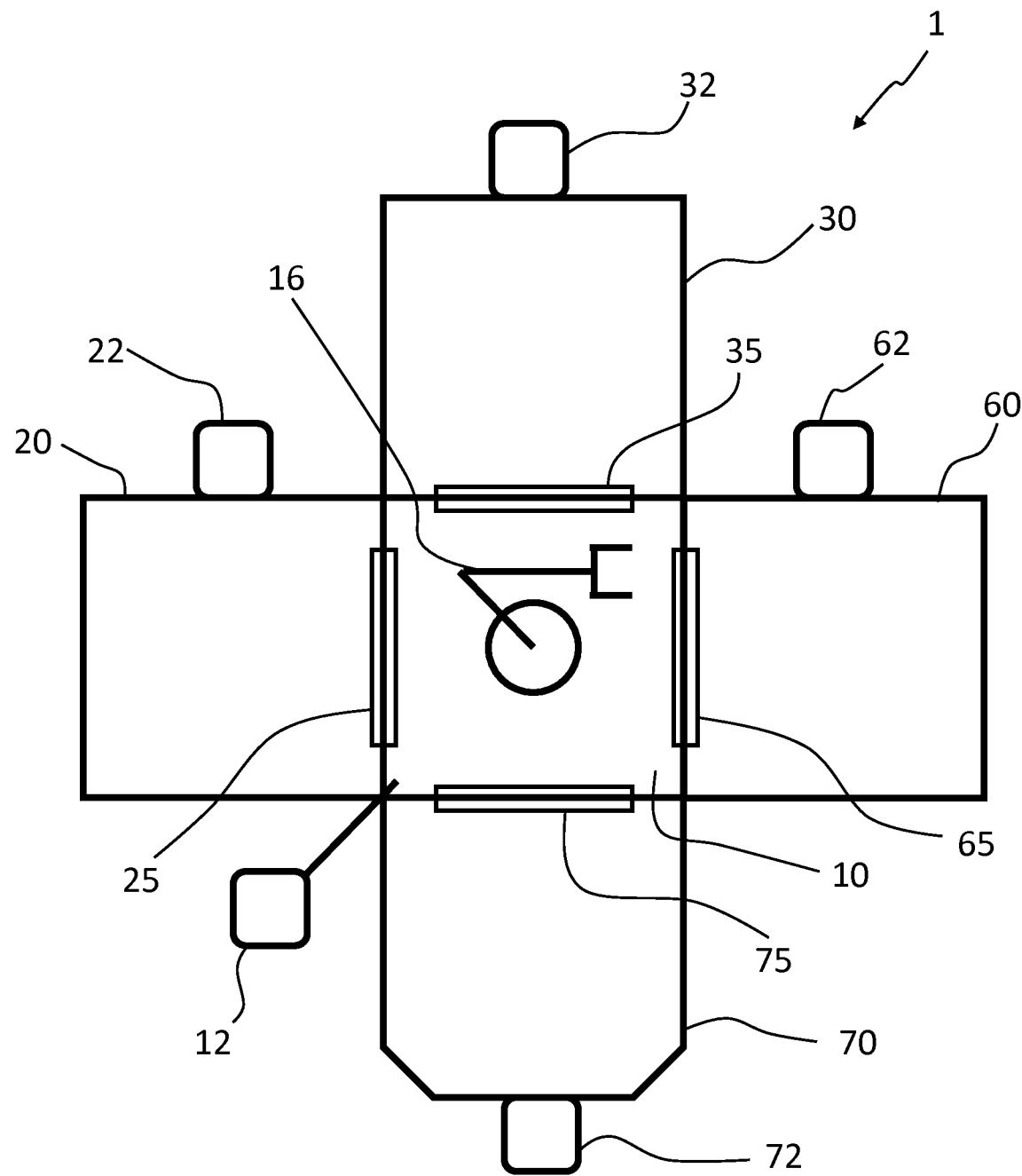
FIG. 1 shows schematically one embodiment of a cluster apparatus according to the present invention.

FIG. 1 shows one embodiment of a cluster apparatus 1 according to the present invention. The cluster apparatus 1 comprises a transport chamber 10 and a cluster vacuum device 12 connected to the transport chamber 10 for providing vacuum atmosphere inside the transport chamber 10. A transport robot 16 arranged inside the transport chamber 10.

The cluster apparatus 1 further comprises a first single substrate reactor 20 connected to the transport chamber 10 via a first transport connection 25 via which a substrate is loaded on the first single substrate reactor 20 and unloaded from there, and with which the first single substrate reactor 20 is opened and closed. The first transport connection 25 may comprise for example a gate valve. A first vacuum device 22 is connected to the first single substrate reactor 20 for providing vacuum atmosphere inside the first single substrate reactor 20.

The cluster apparatus 1 comprises a second single substrate reactor 30 connected to the transport chamber 10 via a second transport connection 55 via which a substrate is loaded on the second substrate reactor 30 and unloaded from there, and with which the second single substrate reactor 30 is opened and closed. The second transport connection 35 may comprise for example a gate valve. A second vacuum device 32 is connected to the second single substrate reactor 30 for providing vacuum atmosphere inside the second single substrate reactor 30.

In this embodiment, the cluster apparatus 1 further comprises a third single substrate reactor 60 connected to the transport chamber 10 via a third transport connection 65 via which a substrate is loaded on the third single substrate reactor 60 and unloaded from there, and with which the third single substrate reactor 60 is open and closed. The third transport connection 65 may comprise for example a gate valve. A third vacuum device 62 is connected to the third single substrate reactor 60 for providing vacuum atmosphere inside the third single substrate reactor 60.

The cluster apparatus 1 further comprises a buffer chamber 70 connected to the transport chamber 10 via a buffer transport connection 75 via which a substrate is loaded on the buffer chamber 70 and unloaded from there, and with which the buffer chamber 70 is open and closed. The buffer transport connection 75 may comprise for example a gate valve. A buffer vacuum device 72 is connected to the buffer chamber 70 for providing vacuum atmosphere inside the buffer chamber 70.

It should be noted, that one vacuum device, for example the cluster vacuum device 12, may be connected to all the reactors 20, 30, 60 and buffer chamber 70 instead of each comprising own vacuum device. Alternatively, two or more reactors 20, 30, 60 may have a common vacuum device and the buffer chamber 70 and the transport chamber 70 have a common vacuum device. This applies to all embodiments of the invention.

Figure 22:
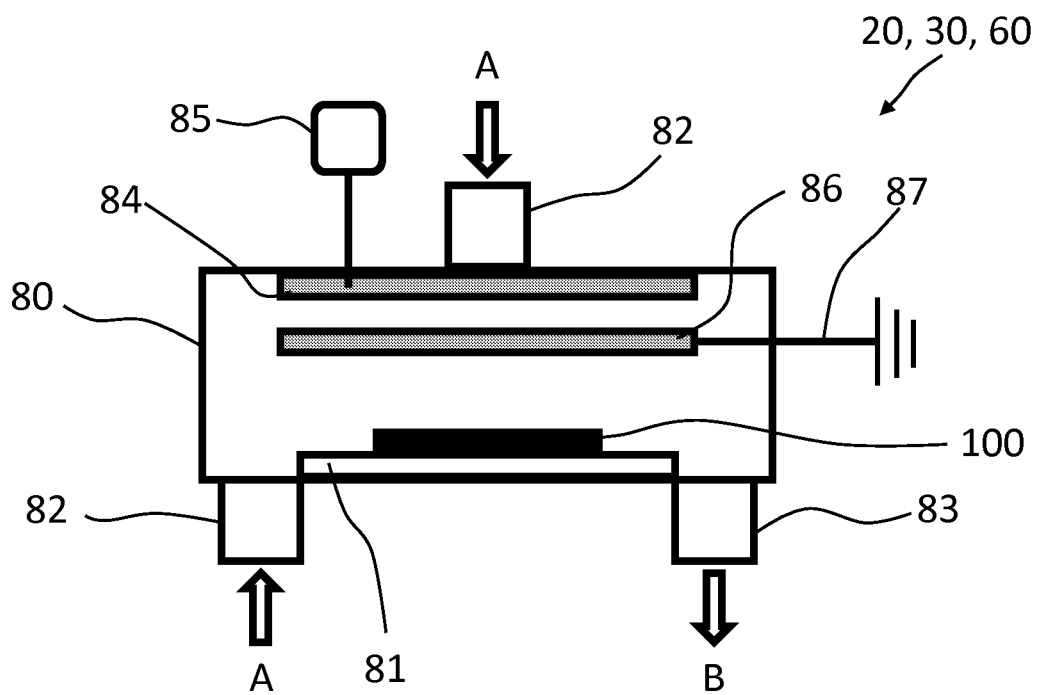
FIGS. 22 and 23 shows schematically different embodiments of a single substrate reactor.
Figure 23:
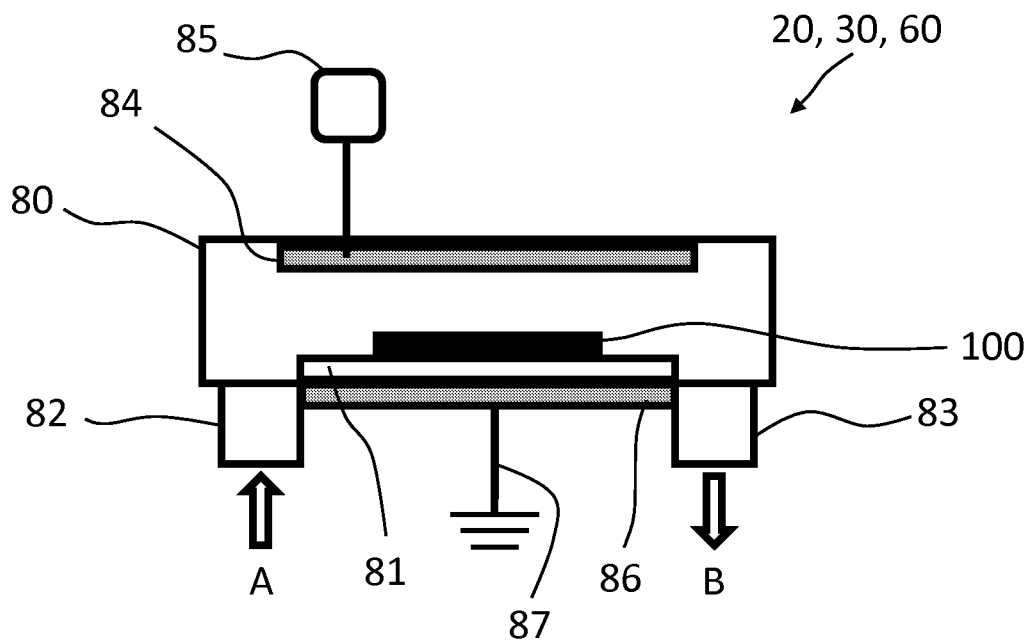

FIGS. 22 and 23 show some exemplary embodiments of the single substrate reactors 20, 30, 60.

FIG. 22 shows a shower head single substrate reactor 20, 30, 60 comprising a reaction chamber 80 provided with a substrate support 81 for supporting one substrate 100 inside the reaction chamber 80. The shower head single substrate reactor 20, 30, 60 further comprises a gas inlet 82 provided to the top wall of the reaction chamber 80 for supplying process gas flow A into the reaction chamber 80. The may also be one or more additional gas inlets 82 provided to the bottom wall of the reaction chamber 80 for supplying process gas flow A into the reaction chamber 80. The additional gas inlet 82 in the bottom wall may also be omitted. One or more outlet(s) 83, preferably one, are provided to the bottom wall of the reaction chamber 80 for discharging exhaust gas flow B from the reaction chamber 80. The shower head single substrate reactor 20, 30, 60 further comprises first and second plasma electrodes 84, 86 provided to the reaction chamber 80 between the gas inlet 82 and the substrate support 81 for generating plasma. The first plasma electrode 84 is connected to voltage source 85 and the second plasma electrode 86 is grounded 87.

FIG. 23 shows a lateral flow single substrate reactor 20, 30, 60 comprising a reaction chamber 80 provided with a substrate support 81 for supporting one substrate 100 inside the reaction chamber 80. The lateral flow single substrate reactor 20, 30, 60 further comprises a gas inlet 82 provided to first end or side wall or vicinity thereof of the reaction chamber 80 for supplying process gas flow A into the reaction chamber 80. One or more outlet(s) 83 are provided to a second end or second side wall or in vicinity thereof of the reaction chamber 80 for discharging exhaust gas flow B from the reaction chamber 80. The lateral flow single substrate reactor 20, 30, 60 further comprises first and second plasma electrodes 84, 86. The first plasma electrode 84 in connected to a voltage source 85 and arranged above the substrate support 81 and the substrate 100 in the reaction chamber. The second plasma electrode 86 is grounded 87 and arranged below the substrate 100 and substrate support 81, or to the substrate support 81.

In FIG. 1, the cluster apparatus may comprise two or more single substrate reactors 20, 30, 60. Further, all the single substrate reactors may be similar with each other, or at least one of the single substrate reactors 20, 30, 60 may be different. For example, not all the single substrate reactors need to comprise the plasma electrodes and be plasma single substrate reactors.

It should be noted, that in the present invention the single substrate reactor may be any kind of reactor arranged to process one substrate and comprising the plasma electrodes for plasma processing.

The cluster apparatus 1 is arranged to carry out a method according to the present invention. The method comprises the flowing steps carried out in the flowing order:
a) subjecting the surface of the substrate 100 to a surface preparation step for providing a prepared substrate surface;
b) providing an interface layer on the prepared substrate surface of the substrate 100 for forming an interfaced substrate surface; and
c) providing a functional layer on the interfaced substrate surface of the substrate 100 for providing a functionally coated substrate.

In the following specific embodiments, the steps are considered as disclosed below. However, the steps and precursors and materials used in the steps a), b) and c) may also vary and may be different within the scope of the present invention.

In the examples, the method is applied to a semiconductor substrate, compound semiconductor substrate, or group iii-v semiconductor substrate 100.

In step a) the surface of the substrate 100 is subjected to a surface preparation step which is carried out in a single substrate plasma reactor 20, 30, 60 for providing surface cleaning to the surface of the substrate 100. The steps a) comprises thus a plasma cleaning carried out separately to one substrate at a time.

The plasma cleaning in step is carried out by utilizing $NH_3$ plasma process in which $NH_3$ gas is supplied to the single substrate plasma reactor 20, 30, 60 and the plasma is ignited with the plasma electrodes 84, 86. This step a) takes about 2 to 3 minutes to carry out.

In an alternative embodiment, the step a) is carried out by utilizing $H_2S$ gas phase cleaning in a single substrate reactor 20, 30, 60. In this case, the step a) is carried without plasma processing. Thus, the single substrate reactor 20, 30, 60 may be provided with or without plasma electrodes 84, 86 for carrying out step 84, 86.

$H_2S$ gas phase cleaning may be used especially for group iii-v semiconductor substrate.

In step a) the surface of the substrate 100 is provided with the prepared substrate surface.

In step b) an interface layer is provided on the prepared substrate surface in a single substrate plasma reactor 20, 30, 60 for providing interface material layer on the prepared substrate surface. The steps b) comprises thus a plasma enhanced deposition step carried out separately to one substrate at a time. The step b) may be carried out in the same single substrate plasma reactor 20, 30, 60 as step a) or in a different single substrate plasma reactor 20, 30, 60 in the cluster apparatus 1.

The plasma enhanced deposition step is preferably carried out in a plasma atomic layer deposition reactor as a plasma enhanced atomic layer deposition process.

In some preferred embodiments, the step b) is carried out in the plasma enhanced atomic layer deposition process and comprises depositing or providing an aluminium nitride interface layer on the prepared substrate surface. In this process, aluminium chloride $AlCl_3$ or trimethylaluminum $Al_2(CH_3)_6$, TMA, may be used aluminium precursors, and ammonia $NH_3$ as nitrogen precursor. The AlN interface layer is grown to have 1 to 3 nm thickness. Thus, it is a fairly quick process step.

In an alternative embodiment, the step b) is carried out in the plasma enhanced atomic layer deposition process and comprises depositing or providing an $SiO_2$-layer, $Si_3N_4$-layer, $Al_2O_3$-layer, TiN-layer, WN-layer, or the like layer on the interfaced substrate layer.

In step b) the prepared substrate surface of the substrate 100 is provided with the interfaced substrate surface. The interfaced substrate surface means substrate surface with the interface layer.

As disclosed above, both the step a) and step b) are single substrate plasma processes and thus they may be carried out in a same or different single substrate reactors in the cluster apparatus.

In step c) the function layer is deposited on the interfaced substrate surface in a single substrate reactor 20, 30, 60 or in a batch process reactor 40 provided to the cluster apparatus 1.

The step c) is carried out with gas phase deposition method.

The step c) is carried out in a single substrate atomic layer deposition reactor or preferably in a batch process atomic layer deposition reactor.

Thus, a case of single layer atomic layer deposition reactor, the steps b) and c) may be carried in the same or different reactors.

In some preferred embodiments, the step c) is carried out with the batch atomic layer deposition process and comprises depositing or providing an aluminium oxide $Al_2O_3$ functional layer on the interfaced substrate surface. In this process trimethylaluminum $Al_2(CH_3)_6$, TMA, may be used aluminium precursor, and $H_2O$ or $O_3$ the second precursor. The $Al_2O_3$ functional layer is grown to have 30 to 50 nm thickness. Thus, step c) takes considerably longer process time than the steps a) and b).

Thus, the functional layer of $Al_2O_3$ is a dielectric layer.

The dielectric layer is especially provided on a semiconductor substrate or a group iii-v semiconductor substrate.

Figure 2:
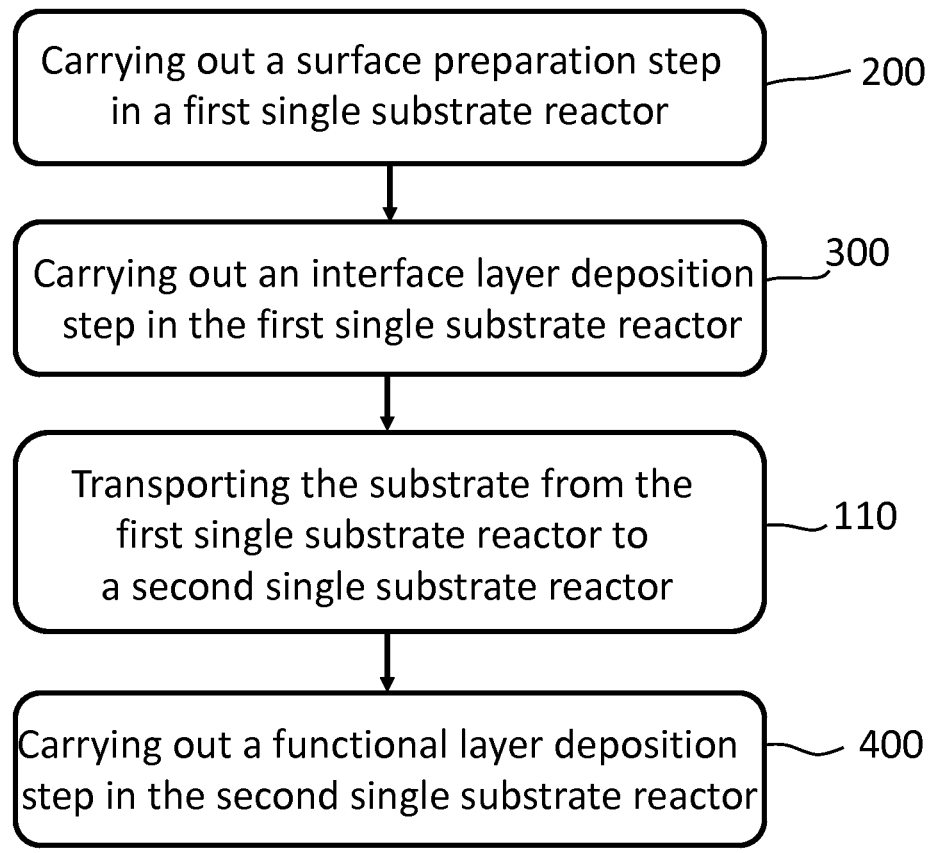
FIGS. 2 to 4 shows flow charts of methods carried out with the cluster apparatus of FIG. 1.

FIG. 2 shows a flow chart of one embodiment according to the present invention utilizing the cluster apparatus of FIG. 1.

It should be noted, that the all the steps a), b) and c) are carried out in vacuum atmosphere in the process reactors 20, 30, 40, 60.

In the flowing transporting the substrate 100 between process reactors 20, 30, 40, 60 and the buffer chamber 70 is carried out with the transport robot 16 provided in the transport chamber 10 and via the transport chamber 10.

The method comprises carrying out step a) in the first single substrate reactor 20 in 200, carrying out step b) also in the first single substrate reactor 20 in 300, transporting the substrate 100 after step b) from the first single substrate reactor 20 to the second single substrate reactor 30 via the transport chamber 10 under vacuum atmosphere in 110, and carrying out step c) in the second single substrate reactor 30 in 400.

The transporting 110 of the substrate may also comprise transporting the substrate 100 from the first single substrate reactor 20 to the buffer chamber 70, storing the substrate temporarily to the buffer chamber 70 and transporting the substrate 100 from the buffer chamber 70 to the second single substrate reactor 30.

In the embodiment of FIG. 2 a plasma single substrate reactor may be utilized for steps a) and b) and a single substrate deposition reactor without plasma for step c) without plasma electrodes. Alternatively, the first and second single substrate reactors 20, 30, 60 may all be plasma single substrate reactors.

Figure 3:
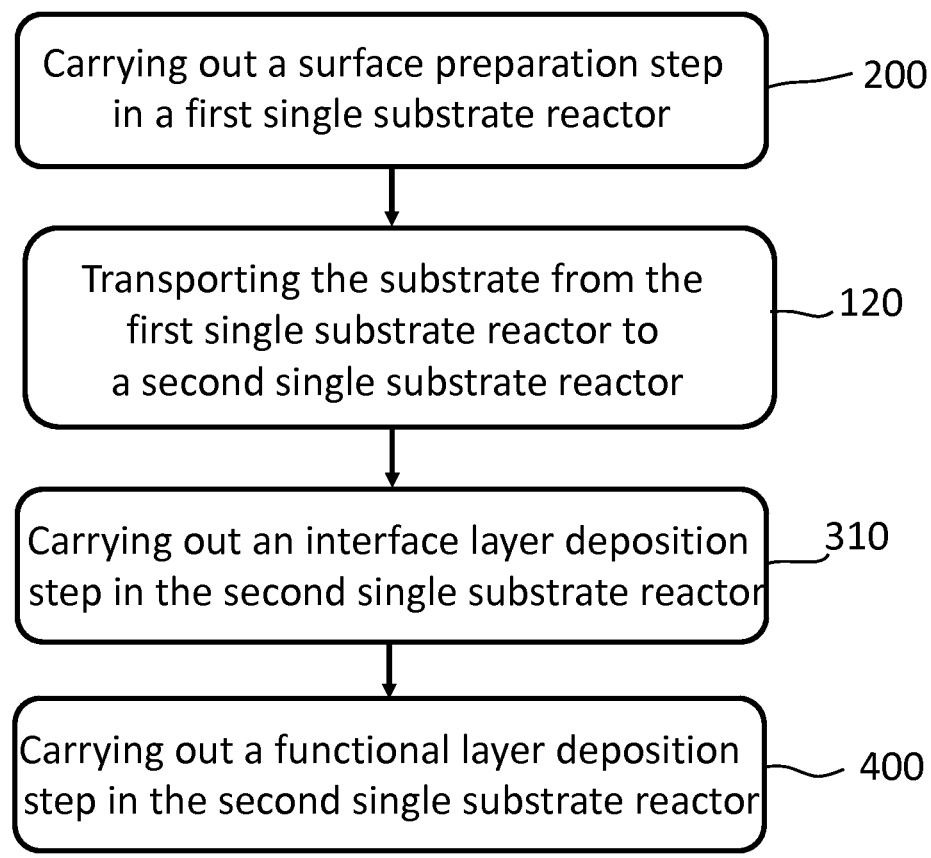

FIG. 3 shows a flow chart of another embodiment of the method to be carried with the cluster apparatus of FIG. 1.

The method according to FIG. 3 comprises carrying out step a) in the single substrate reactor 20 in 200, transporting the substrate 100 after step a) from the first single substrate reactor 20 to the second single substrate reactor 30 via the transport chamber 10 under vacuum atmosphere in 120 and carrying out steps b) and c) in the second single substrate reactor 30.

The transporting 120 of the substrate may also comprise transporting the substrate 100 from the first single substrate reactor 20 to the buffer chamber 70, storing the substrate temporarily to the buffer chamber 70 and transporting the substrate 100 from the buffer chamber 70 to the second single substrate reactor 30.

In the embodiment of FIG. 3, a plasma single substrate reactor may be utilized for steps a) and a plasma single substrate deposition reactor for steps b) and c) with plasma electrodes. In step c) the plasma electrodes or plasma feature may not be utilized, is desirable. Further, the first single substrate reactor 20 does not need be a deposition or atomic layer deposition reactor. Alternatively, the first and second single substrate reactors 20, 30, 60 may all be plasma single substrate reactors.

Figure 4:
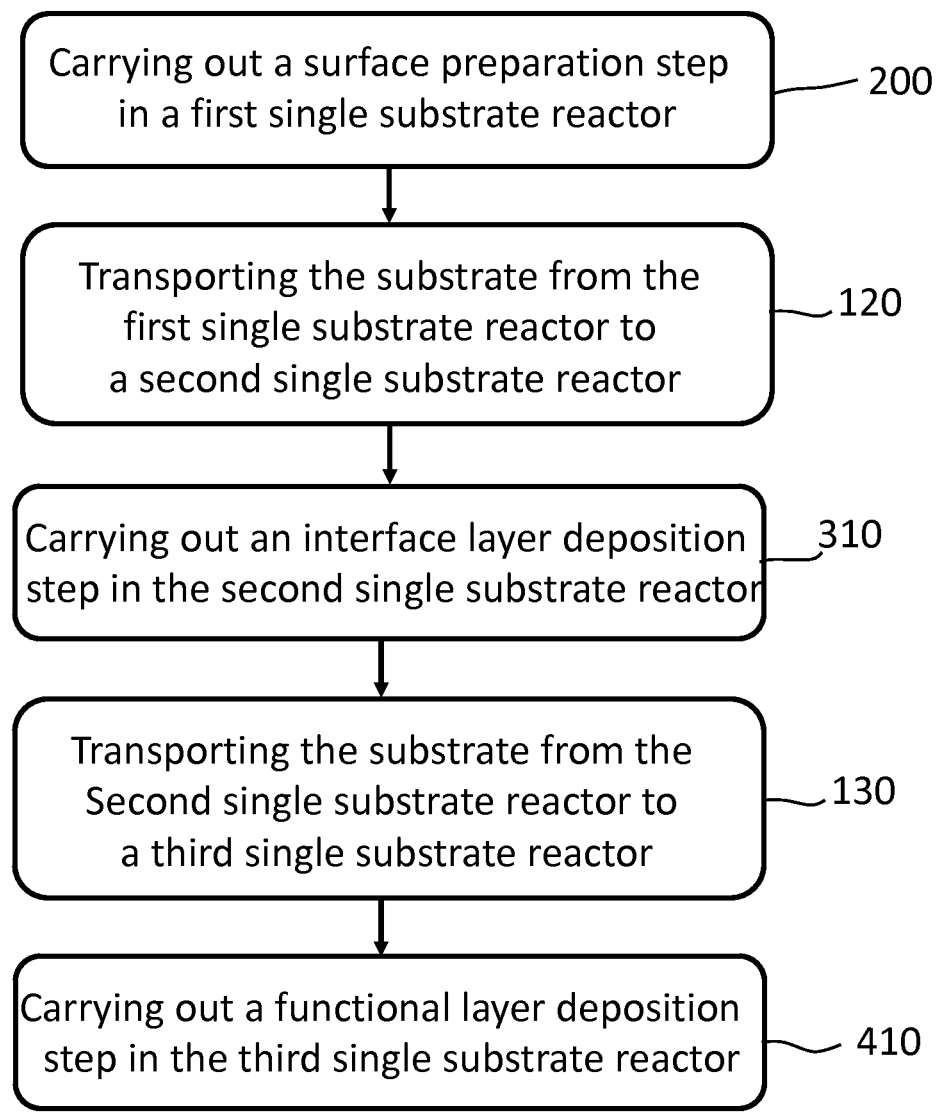

FIG. 4 shows a flow chart of another embodiment of the method to be carried with the cluster apparatus of FIG. 1.

The method according to FIG. 4 comprises carrying out step a) in the first single substrate reactor 20 in 200, transporting the substrate 100 after step a) from the first single substrate reactor 20 to the second single substrate reactor 30 via the transport chamber 10 under vacuum atmosphere in 120, carrying out step b) in the second single substrate reactor 30 in 310, transporting the substrate 100 after step b) from the second single substrate reactor 30 to a third single substrate reactor 60 via the transport chamber 10 under vacuum atmosphere in 130 and carrying out step c) in the third single substrate reactor 60 in 410.

The transporting 120 of the substrate may also comprise transporting the substrate 100 from the first single substrate reactor 20 to the buffer chamber 70, storing the substrate temporarily to the buffer chamber 70 and transporting the substrate 100 from the buffer chamber 70 to the second single substrate reactor 30. Similarly or alternatively, transporting 130 of the substrate may also comprise transporting the substrate 100 from the second single substrate reactor 20 to the buffer chamber 70, storing the substrate temporarily to the buffer chamber 70 and transporting the substrate 100 from the buffer chamber 70 to the third single substrate reactor 60.

In the embodiment of FIG. 4, a plasma single substrate reactors may be utilized for steps a) and b) and a single substrate deposition reactor without plasma for step c) without plasma electrodes. Alternatively, also the third single substrate reactor 60 may all be plasma single substrate reactor, but in step c) the plasma electrodes or plasma feature may not be utilized, is desirable. Further, the first single substrate reactor 20 does not need be a deposition or atomic layer deposition reactor. The second singe substrate reactor 30 is plasma deposition reactor or plasma atomic layer deposition reactor.

Figure 5:
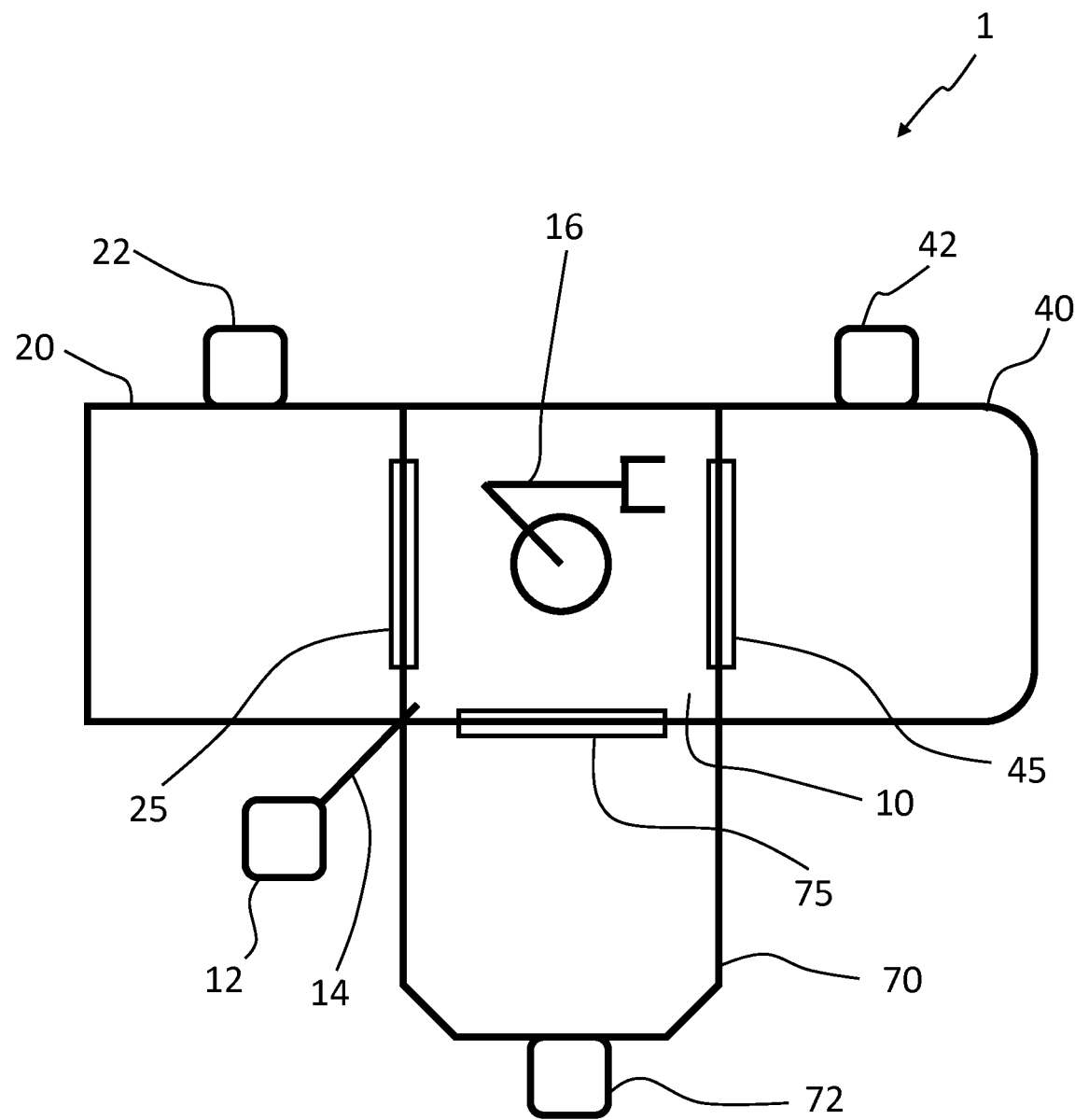
FIG. 5 shows schematically another embodiment of a cluster apparatus according to the present invention.

FIG. 5 shows another embodiment of a cluster apparatus 1 according to the present invention. The cluster apparatus 1 comprises the transport chamber 10 and the cluster vacuum device 12 connected to the transport chamber 10 for providing vacuum atmosphere inside the transport chamber 10. The transport robot 16 is arranged inside the transport chamber 10.

The cluster apparatus 1 further comprises the first single substrate reactor 20 connected to the transport chamber 10 via the first transport connection 25 via which a substrate is loaded on the first single substrate reactor 20 and unloaded from there, and with which the first single substrate reactor 20 is opened and closed. The first vacuum device 22 is connected to the first single substrate reactor 20 for providing vacuum atmosphere inside the first single substrate reactor 20.

The cluster apparatus 1 comprises a first batch process reactor 40 connected to the transport chamber 10 via a batch transport connection 45 via which a substrate is loaded on the first batch process reactor 40 and unloaded from there, and with which first batch process reactor 40 is opened and closed. The batch transport connection 45 may comprise for example a gate valve. A batch vacuum device 42 is connected to the first batch reactor 40 for providing vacuum atmosphere inside the first batch reactor 40.

The cluster apparatus 1 of FIG. 5 further comprises the buffer chamber 70 connected to the transport chamber 10 via the buffer transport connection 75 via which a substrate is loaded on the buffer chamber 70 and unloaded from there, and with which the buffer chamber 70 is open and closed. The buffer vacuum device 72 is connected to the buffer chamber 70 for providing vacuum atmosphere inside the buffer chamber 70.

Accordingly, the cluster apparatus 1 of FIG. 5 comprises one single substrate reactor 20 arranged to process one substrate at a time. Further, the cluster apparatus comprises one batch process reactor 40 arranged to process two or more substrates at the same time.

In this embodiment, the first single substrate reactor 20 is a plasma deposition reactor or plasma atomic layer deposition reactor comprising plasma electrodes 84, 86.

The first single substrate reactor 20 may be reactor as disclosed in connection with the cluster apparatus 1 of FIG. 1 and/or as shown in FIGS. 22 and 23.

Figure 24:
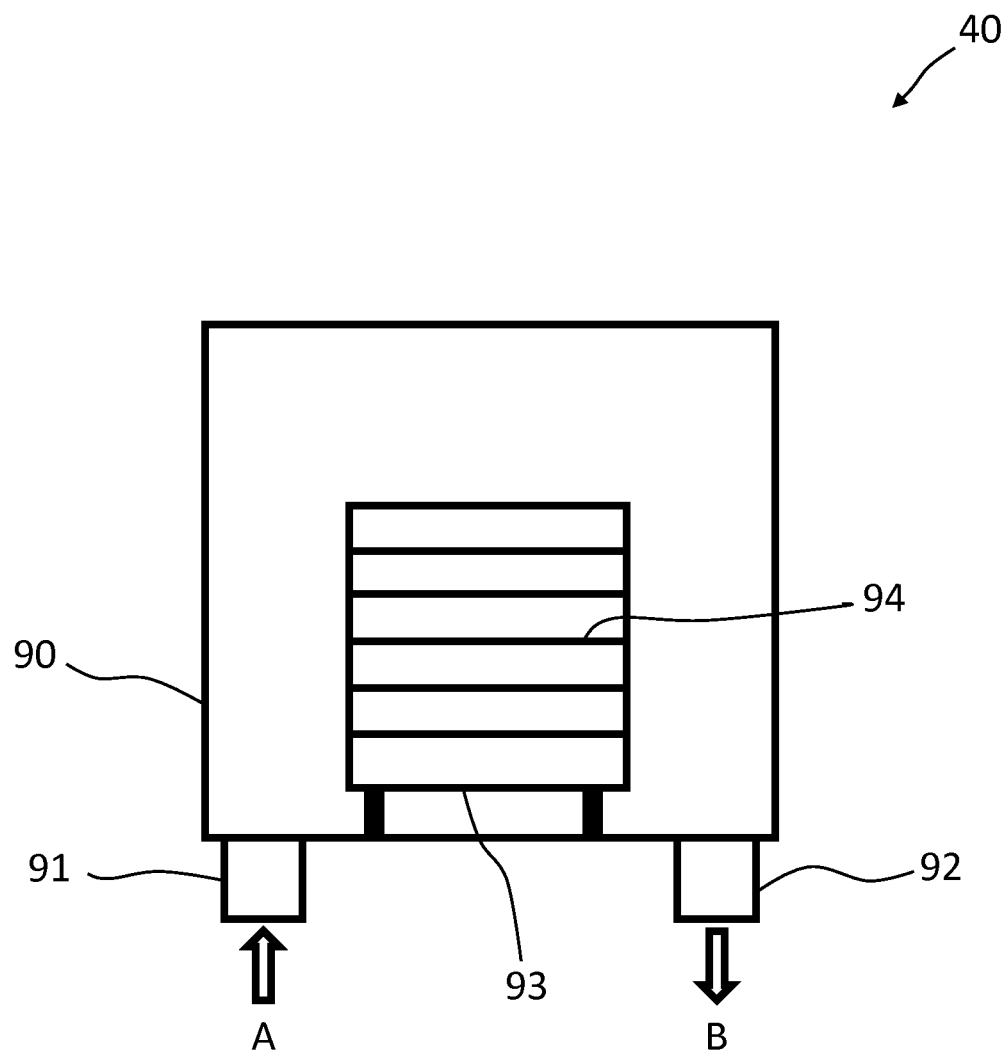
FIG. 24 shows schematically one embodiment of batch process reactor.

FIG. 24 shows one exemplary embodiments of the batch process reactor 40.

FIG. 24 shows the batch process reactor comprising a batch reaction chamber 90 provided with a substrate rack 93 having two or more substrate holders 94 for supporting two or more substrates 100, respectively, inside the batch reaction chamber 90. The batch process reactor further comprises a gas inlet 91 a provided to a bottom wall or first end or side wall or vicinity thereof of the reaction chamber 90 for supplying process gas flow A into the batch reaction chamber 90. One or more outlet(s) 92 are provided to the bottom wall or a second end or second side wall or in vicinity thereof of the reaction chamber 90 for discharging exhaust gas flow B from the batch reaction chamber 90.

The present invention is not restricted to any particular batch process reactor 40, but the batch process reactor 40 is one which is arranged to process several substrates at the same time. Preferably, the batch process reactor 40 is an atomic layer deposition batch process reactor.

When the batch process reactor is utilized, the step c) comprises processing two or more substrates at the same time the first batch process reactor 40 by depositing the function layer on the interfaced substrate surfaces of the two or more substrates.

Further, the step c) is carried out with batch process gas phase deposition method, or a batch process atomic layer deposition reactor.

Therefore, the step c) may comprise depositing or providing an aluminium oxide $Al_2O_3$ functional layer on the interfaced substrate surface of the several substrates 100 in the first batch process atomic layer deposition reactor.

Figure 6:
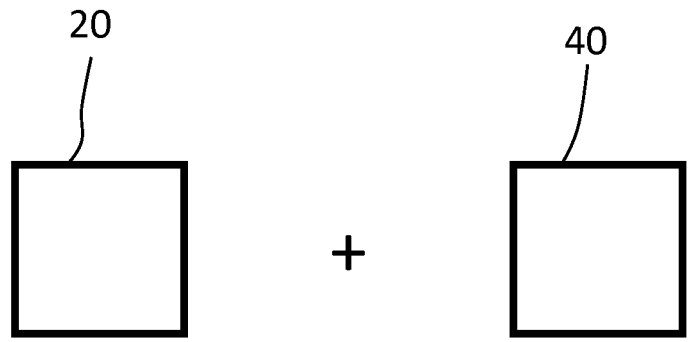
FIGS. 6 to 8 shows flow charts of methods carried out with the cluster apparatus of FIG. 5.

FIG. 6 shows schematically utilization of the cluster apparatus 1 of FIG. 5 for carrying out the method of the present invention. First, the substrate is processed in the first single substrate reactor 20 and then after that in the first batch process reactor 40.

Figure 7:
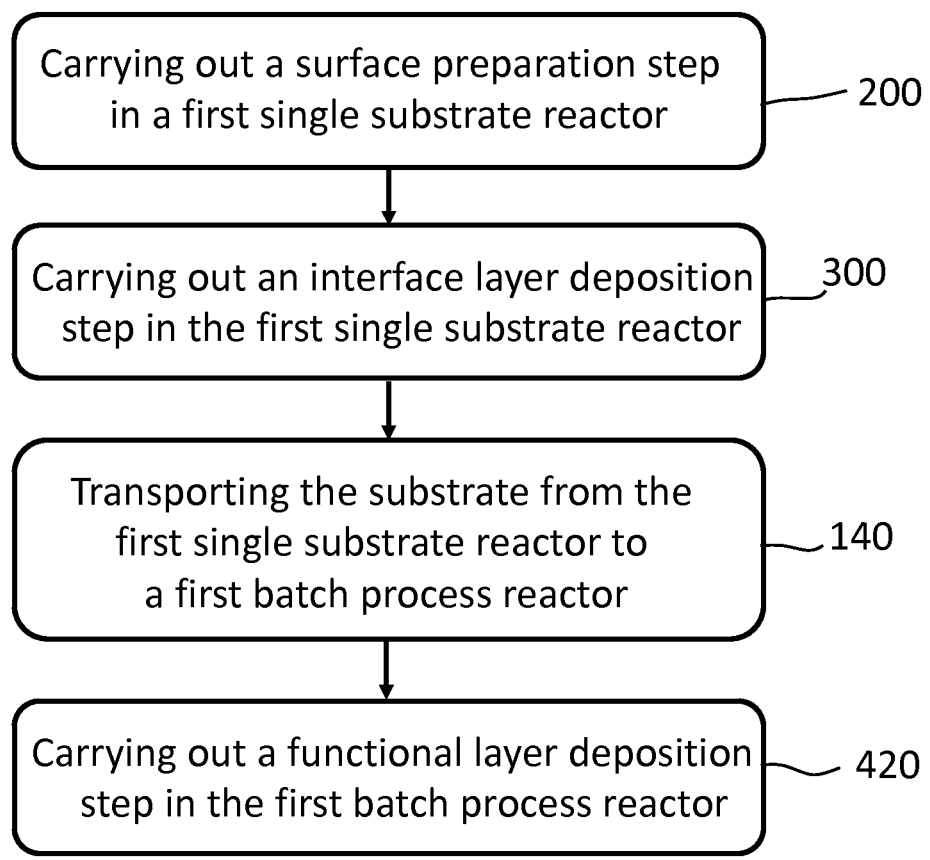

FIG. 7 shows a flow chart of one embodiment according to the present invention utilizing the cluster apparatus of FIG. 5.

It should be noted, that the all the steps a), b) and c) are carried out in vacuum atmosphere in the process reactors 20, 40.

The method comprises carrying out step a) in the first single substrate reactor 20 in 200, carrying out step b) also in the first single substrate reactor 20 in 300, transporting the substrate 100 after step b) from the first single substrate reactor 20 to the batch process reactor 40 via the transport chamber 10 under vacuum atmosphere in 140, and carrying out step c) in the first batch process reactor 40 in 420.

The step c) further comprises processing two or more substrates at the same time in the first batch process reactor 40 for providing the function layer on the interfaced substrate surfaces of the two or more substrates 100 in 420.

The transporting 140 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the first batch process reactor 40.

Accordingly, the first single substrate reactor 20 may carry out steps a) and b) also during step c) in the first batch process reactor 40 and store the substrates 100 interfaced substrate surface to the buffer chamber 70.

Figure 8:
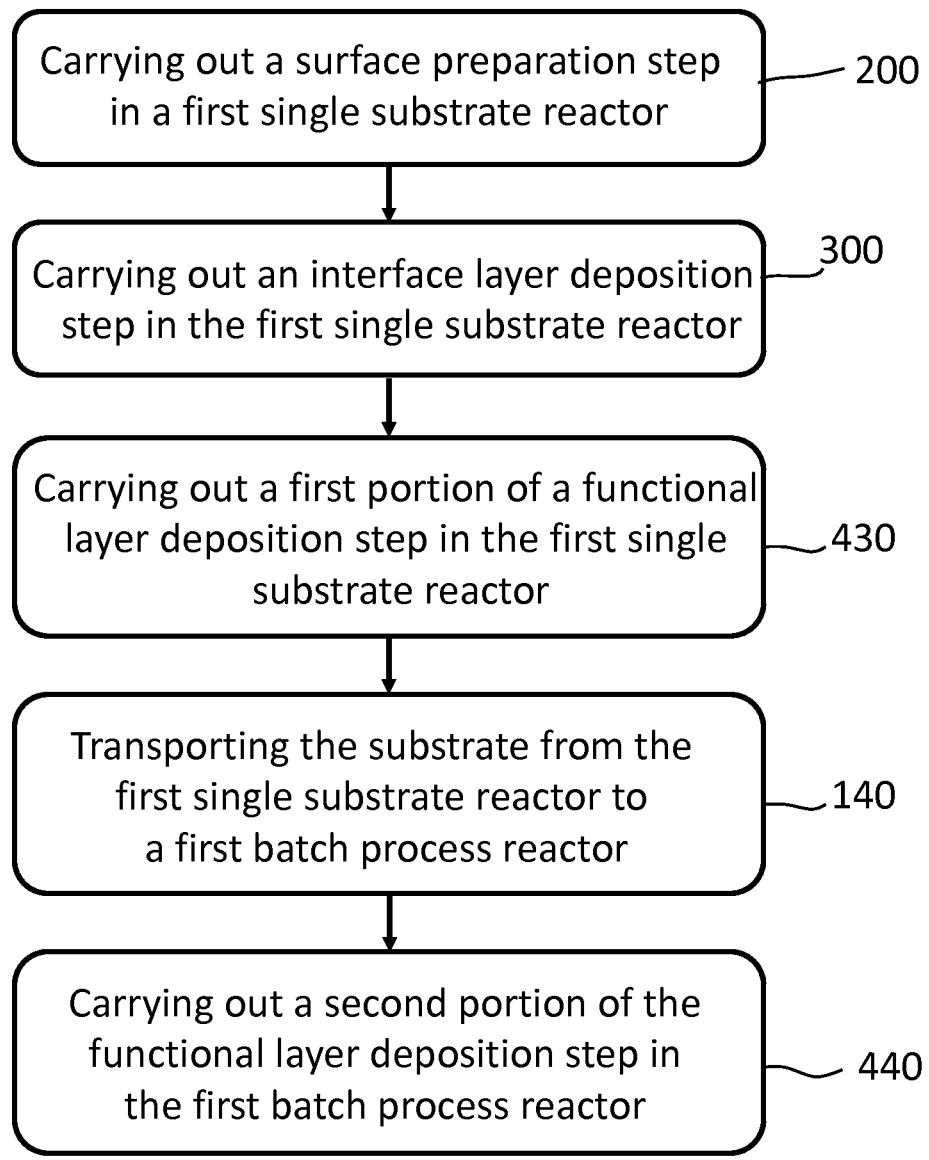

FIG. 8 shows a flow chart of another embodiment according to the present invention utilizing the cluster apparatus of FIG. 5.

The method comprises carrying out step a) in the first single substrate reactor 20 in 200, carrying out step b) also in the first single substrate reactor 20 in 300, carrying out a first portion of step c) in the first single substrate reactor 20 for providing the first portion of the functional layer on the interfaced substrate surface in 430, transporting the substrate 100 after step b) and the first portion of step c) from the first single substrate reactor 20 to the batch process reactor 40 via the transport chamber 10 under vacuum atmosphere in 140, and carrying out the second portion of step c) in the first batch process reactor 40 for providing the second portion of the functional layer on the first portion of the functional layer in 440.

The transporting 140 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the first batch process reactor 40.

Thus, the interfaced substrate surface is protected before transporting the substrate 100 in 140.

Figure 9:
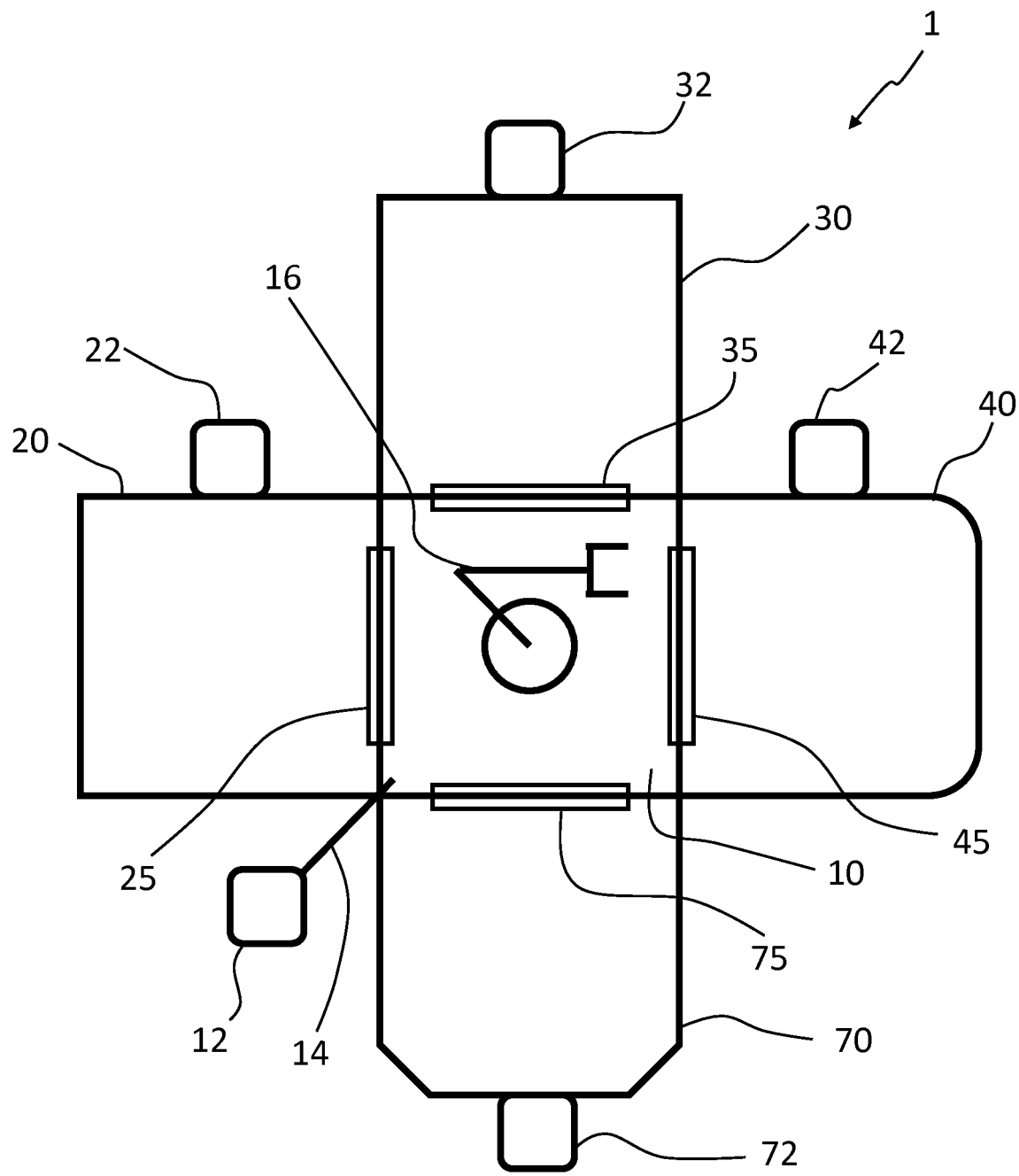
FIG. 9 shows schematically yet another embodiment of a cluster apparatus according to the present invention.

FIG. 9 shows a further embodiment of the cluster apparatus 1. The cluster apparatus 1 comprises the transport chamber 10 and the cluster vacuum device 12 connected to the transport chamber 10 for providing vacuum atmosphere inside the transport chamber 10. The transport robot 16 is arranged inside the transport chamber 10.

The cluster apparatus 1 further comprises the first single substrate reactor 20 connected to the transport chamber 10 via the first transport connection 25 via which a substrate is loaded on the first single substrate reactor 20 and unloaded from there, and with which the first single substrate reactor 20 is opened and closed. The first vacuum device 22 is connected to the first single substrate reactor 20 for providing vacuum atmosphere inside the first single substrate reactor 20.

The cluster apparatus 1 comprises the second single substrate reactor 30 connected to the transport chamber 10 via the second transport connection 55 via which a substrate is loaded on the second substrate reactor 30 and unloaded from there, and with which the second single substrate reactor 30 is opened and closed. The second transport connection 35 may comprise for example a gate valve. A second vacuum device 32 is connected to the second single substrate reactor 30 for providing vacuum atmosphere inside the second single substrate reactor 30.

The cluster apparatus 1 comprises the first batch process reactor 40 connected to the transport chamber 10 via the batch transport connection 45 via which a substrate is loaded on the first batch process reactor 40 and unloaded from there, and with which first batch process reactor 40 is opened and closed. The batch transport connection 45 may comprise for example the gate valve. A batch vacuum device 42 is connected to the first batch reactor 40 for providing vacuum atmosphere inside the first batch reactor 40.

The cluster apparatus 1 of FIG. 9 further comprises the buffer chamber 70 connected to the transport chamber 10 via the buffer transport connection 75 via which a substrate is loaded on the buffer chamber 70 and unloaded from there, and with which the buffer chamber 70 is open and closed. The buffer vacuum device 72 is connected to the buffer chamber 70 for providing vacuum atmosphere inside the buffer chamber 70.

Accordingly, the cluster apparatus 1 of FIG. 9 comprises two single substrate reactors 20, 30 arranged to process one substrate at a time. Further, the cluster apparatus comprises one batch process reactor 40 arranged to process two or more substrates at the same time.

In this embodiment, the first single substrate reactor 20 is a plasma process reactor or plasma deposition reactor or plasma atomic layer deposition reactor comprising plasma electrodes 84, 86. The first single substrate reactor does not need be a deposition reactor for providing a material layer on the substrate surface, but is can be.

The second single substrate reactor 30 is a plasma deposition reactor or plasma atomic layer deposition reactor comprising plasma electrodes 84, 86. The first single substrate reactor does not need be a deposition reactor for providing a material layer on the substrate surface.

The first and second single substrate reactors 20 and 30 may be reactor as disclosed in connection with the cluster apparatus 1 of FIG. 1 and/or as shown in FIGS. 22 and 23.

It should be noted, the cluster apparatus of the FIG. 9 may be utilized for carrying out the method as disclosed in FIGS. 6, 7, and 8 such that the first and second single substrate reactors 20, 30 are utilized parallel and similar manner to carry out the steps 200, 300 and 200, 300, 430 of FIGS. 7 and 8, respectively. Thus, the two single substrate reactors 20, 30 may supply similar manner processed substrates to the first batch process reactor 40 for increasing efficiency.

Figure 10:
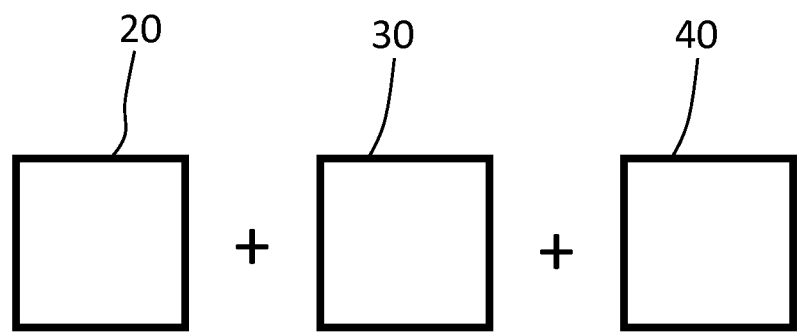
FIGS. 10 to 17 shows flow charts of methods carried out with the cluster apparatus of FIG. 9.

FIG. 10 shows schematically utilization of the cluster apparatus 1 of FIG. 9 for carrying out the method of the present invention. First, the substrate 100 is processed in the first single substrate reactor 20, then the substrate is the second single substrate reactor 30 and finally after that in the first batch process reactor 40.

Figure 11:
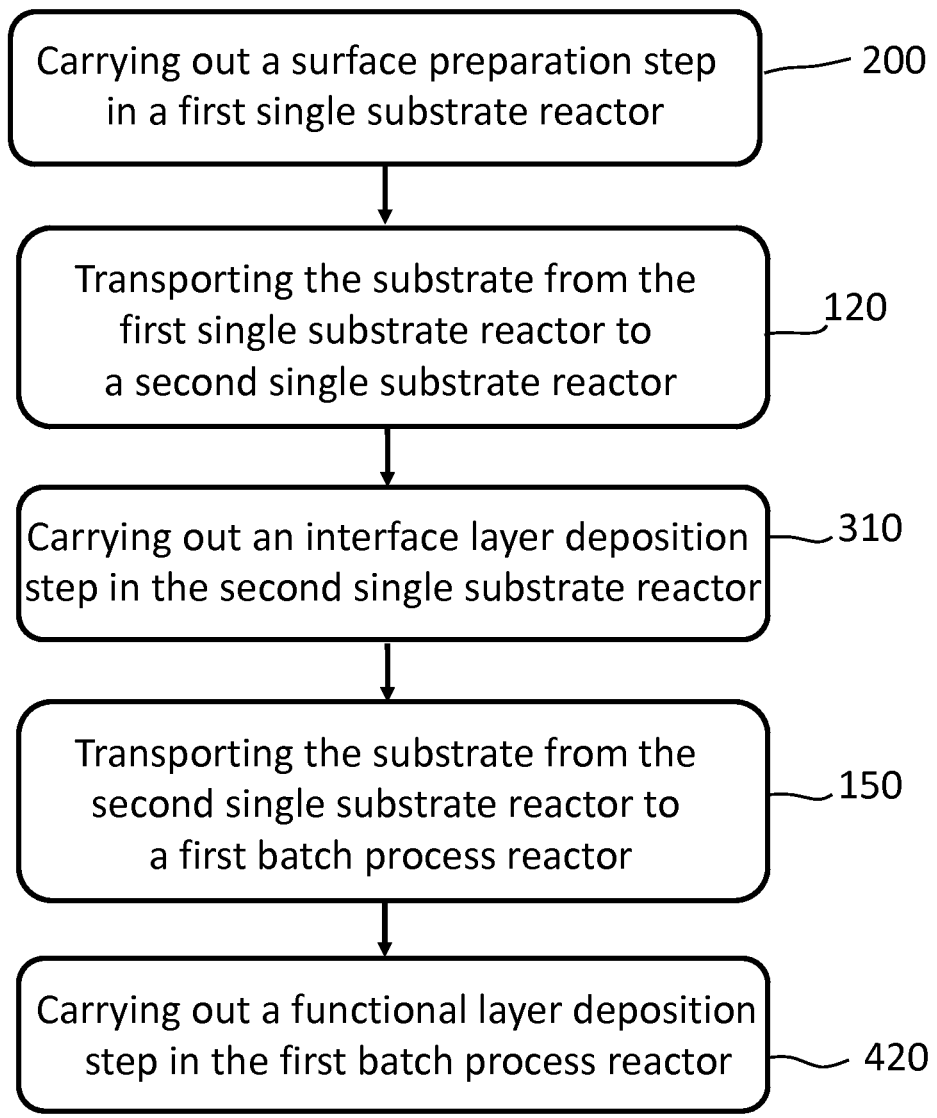

FIG. 11 shows a flow chart of one embodiment according to the present invention utilizing the cluster apparatus of FIG. 9.

It should be noted, that the all the steps a), b) and c) are carried out in vacuum atmosphere in the process reactors 20, 40.

The method comprises carrying out step a) in the first single substrate reactor 20 in 200, transporting the substrate 100 after step a) from the first single substrate reactor 20 to the second single substrate reactor 30 via the transport chamber 10 under vacuum atmosphere in step 120, carrying out step b) in the second single substrate reactor 30 in step 310, transporting the substrate 100 after step b) from the second single substrate reactor 30 to the first batch process reactor 40 via the transport chamber 10 under vacuum atmosphere in 150, and carrying out step c) in the first batch process reactor 40 in 420.

The step c) further comprises processing two or more substrates at the same time in the first batch process reactor 40 for providing the function layer on the interfaced substrate surfaces of the two or more substrates 100 in 420.

The transporting 120 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the second single substrate reactor 30.

The transporting 150 of the substrate may also comprise transporting the substrate 100 from the second single substrate reactor 30 to the buffer chamber 70, storing the substrate 100 temporarily to the buffer chamber 70 and transporting the substrate 100 from the buffer chamber 70 to the first batch process reactor 40.

In this embodiment, the first single substrate reactor 20 may be plasma process reactor, or alternatively plasma deposition reactor, such as plasma atomic layer deposition reactor. The second single substrate reactor 30 may be plasma deposition reactor, such as plasma atomic layer deposition reactor and the first batch process reactor 40 a batch process deposition reactor such as batch process atomic layer deposition reactor.

Figure 12:
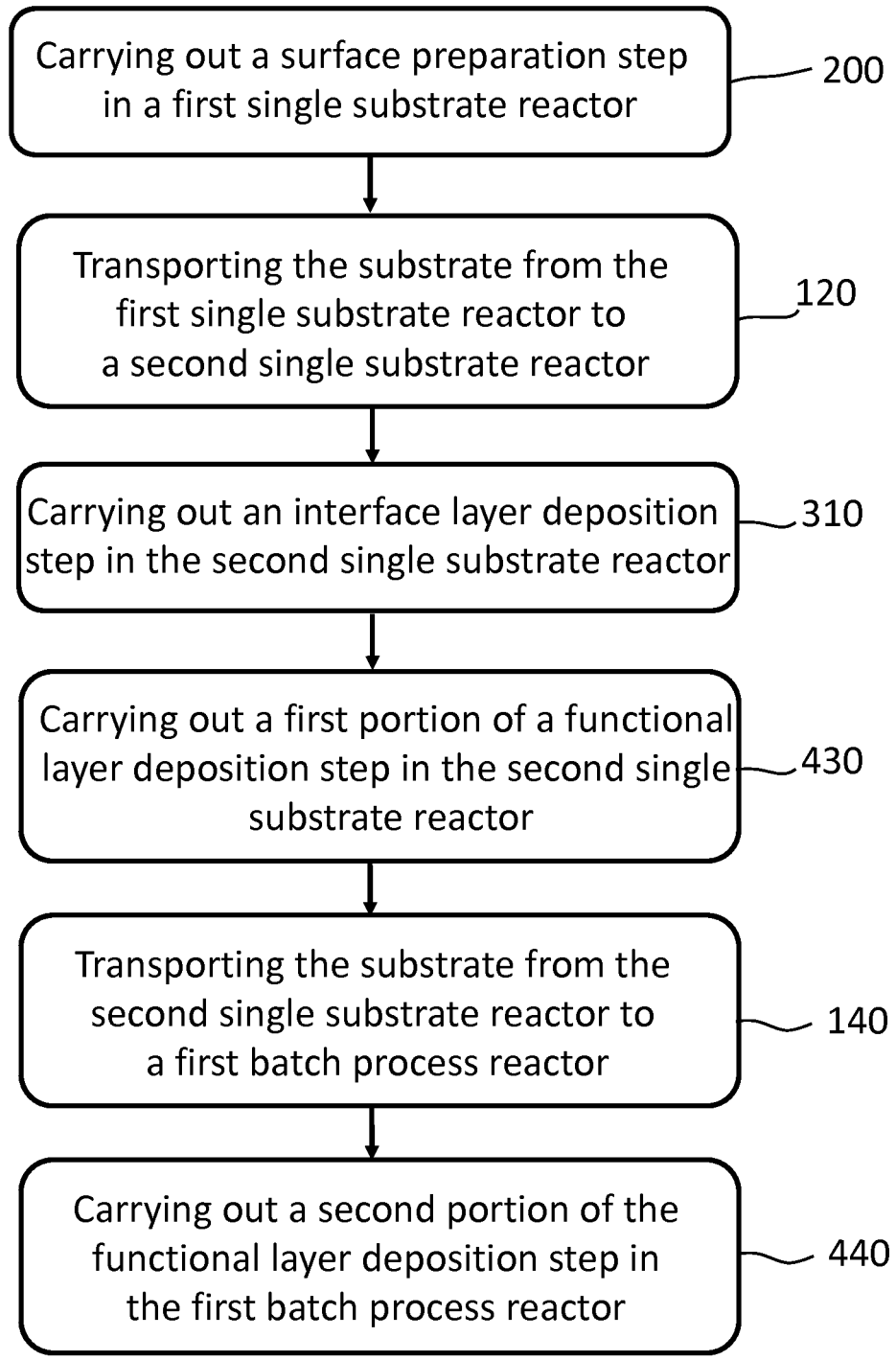

FIG. 12 shows a flow chart of one embodiment according to the present invention utilizing the cluster apparatus of FIG. 9.

It should be noted, that the all the steps a), b) and c) are carried out in vacuum atmosphere in the process reactors 20, 40.

The method comprises carrying out step a) in the first single substrate reactor 20 in 200, transporting the substrate 100 after step a) from the first single substrate reactor 20 to the second single substrate reactor 30 via the transport chamber 10 under vacuum atmosphere in step 120, carrying out step b) in the second single substrate reactor 30 in step 310, carrying out the first portion of step c) in the second single substrate reactor 30 for providing the first portion of the functional layer on the interfaced substrate surface in step 430, transporting the substrate 100 after step b) and the first portion of step c) from the second single substrate reactor 30 to the first batch process reactor 40 via the transport chamber 10 under vacuum atmosphere in 140, and carrying out the second portion of step c) in the first batch process reactor 40 in 420.

The step c) further comprises processing two or more substrates at the same time in the first batch process reactor 40 for providing the second portion of the function layer on the interfaced substrate surfaces of the two or more substrates 100 in 440.

The transporting 120 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the second single substrate reactor 30.

The transporting 140 of the substrate may also comprise transporting the substrate 100 from the second single substrate reactor 30 to the buffer chamber 70, storing the substrate 100 temporarily to the buffer chamber 70 and transporting the substrate 100 from the buffer chamber 70 to the first batch process reactor 40.

In this embodiment, the first single substrate reactor 20 may be plasma process reactor, or alternatively plasma deposition reactor, such as plasma atomic layer deposition reactor. The second single substrate reactor 30 may be plasma deposition reactor, such as plasma atomic layer deposition reactor and the first batch process reactor 40 a batch process deposition reactor such as batch process atomic layer deposition reactor.

Figure 13:
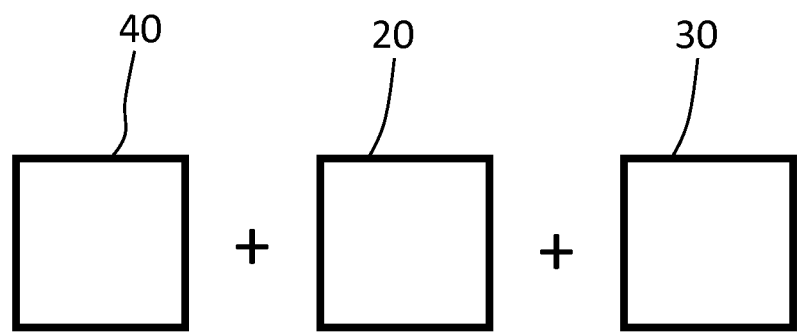

FIG. 13 shows schematically utilization of the cluster apparatus 1 of FIG. 9 for carrying out the method of the present invention. First, the substrate 100 is processed in the first batch reactor 40, then the substrate is the first single substrate reactor 20 and finally after that in the second single substrate reactor 30.

Figure 14:
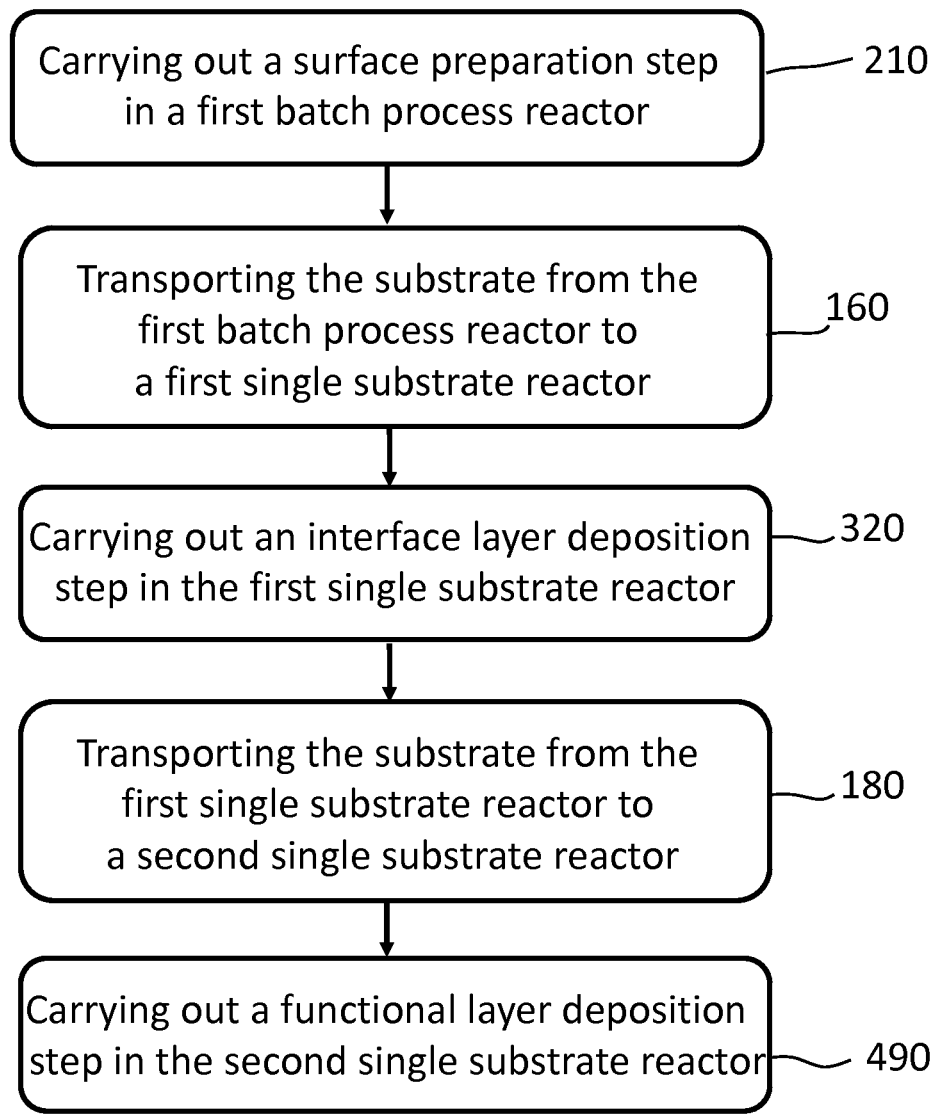

FIG. 14 shows a flow chart of one embodiment according to the present invention utilizing the cluster apparatus of FIG. 9.

It should be noted, that the all the steps a), b) and c) are carried out in vacuum atmosphere in the process reactors 20, 30, 40.

The method comprises carrying out step a) in the first batch process reactor 40 in 210, transporting the substrate 100 after step a) from the first batch process reactor 40 to the first single substrate reactor 20 via the transport chamber 10 under vacuum atmosphere in step 160, carrying out step b) in the first single substrate reactor 20 in step 320, transporting the substrate 100 after step b) from the first single substrate reactor 20 to the second single substrate reactor 30 via the transport chamber 10 under vacuum atmosphere in 180, and carrying out the step c) in the second single substrate reactor 30 in 490.

The step a) further comprises processing two or more substrates at the same time in the first batch process reactor 40 for providing the prepared substrate surface in 210.

The transporting 160 of the substrate may also comprise transporting the substrate 100 from the first batch process reactor 40 to the buffer chamber 70, storing the substrate 100 temporarily to the buffer chamber 70 and transporting the substrate 100 from the buffer chamber 70 to the first single substrate reactor 20.

The transporting 180 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the second single substrate reactor 30.

In this embodiment, the first single substrate reactor 20 may be plasma process reactor, or alternatively plasma deposition reactor, such as plasma atomic layer deposition reactor. The second single substrate reactor 30 may be gas phase deposition reactor or plasma deposition reactor, such as plasma atomic layer deposition reactor and the first batch process reactor 40 a batch process deposition reactor such as batch process atomic layer deposition reactor or another gas phase deposition reactor.

Figure 15:
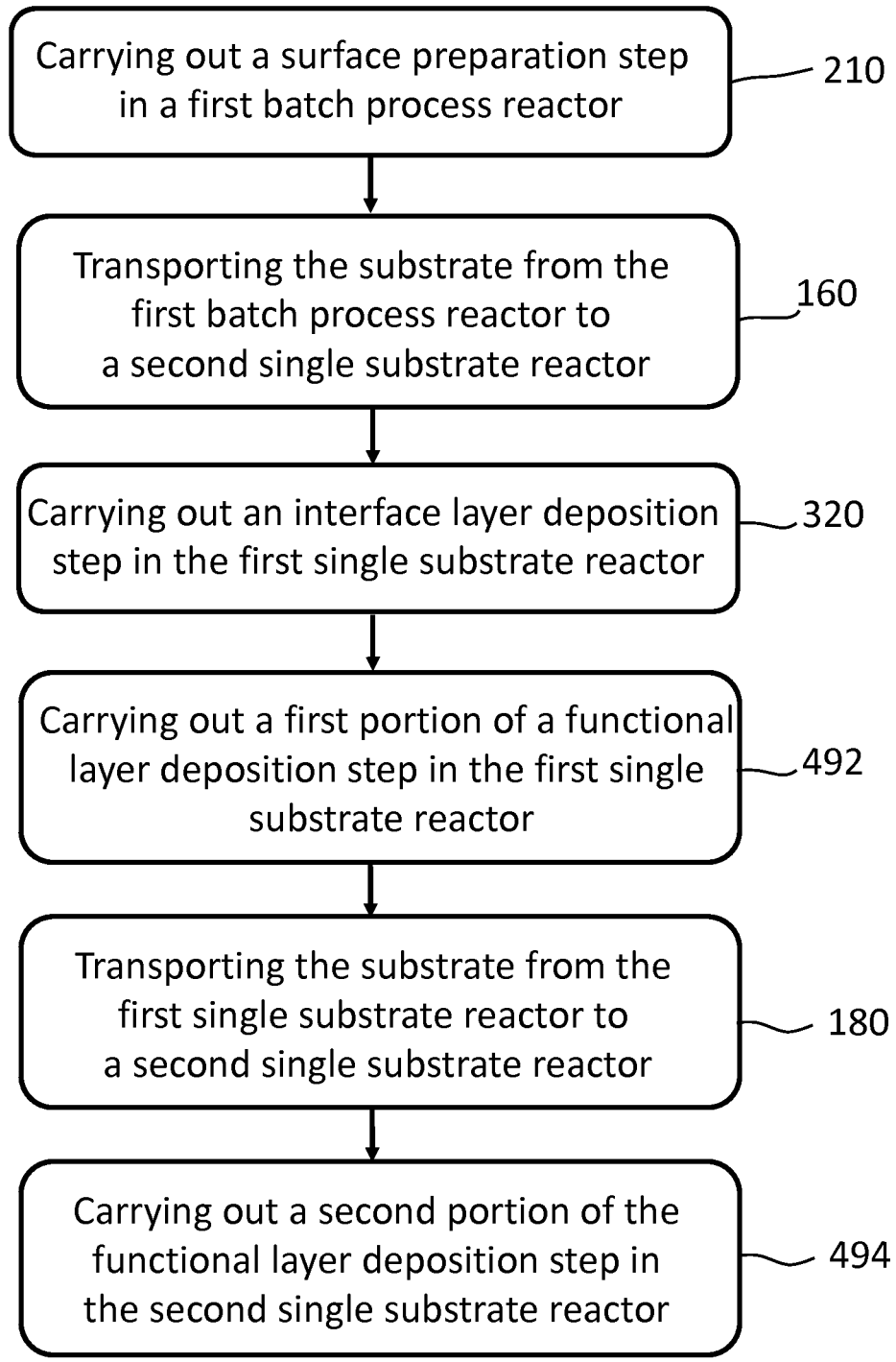

FIG. 15 shows a flow chart of one embodiment according to the present invention utilizing the cluster apparatus of FIG. 9.

It should be noted, that the all the steps a), b) and c) are carried out in vacuum atmosphere in the process reactors 20, 30, 40.

The method comprises carrying out step a) in the first batch process reactor 40 in 210, transporting the substrate 100 after step a) from the first batch process reactor 40 to the first single substrate reactor 20 via the transport chamber 10 under vacuum atmosphere in step 160, carrying out step b) in the first single substrate reactor 20 in step 320, carrying out the first portion of step c) in the first single substrate reactor 20 in 492, transporting the substrate 100 after step b) and the first portion of step c) from the first single substrate reactor 20 to the second single substrate reactor 30 via the transport chamber 10 under vacuum atmosphere in 180, and carrying out the second portion of step c) in the second single substrate reactor 30 in 494.

The step a) further comprises processing two or more substrates at the same time in the first batch process reactor 40 for providing the prepared substrate surface in 210.

The transporting 160 of the substrate may also comprise transporting the substrate 100 from the first batch process reactor 40 to the buffer chamber 70, storing the substrate 100 temporarily to the buffer chamber 70 and transporting the substrate 100 from the buffer chamber 70 to the first single substrate reactor 20.

The transporting 180 of the substrate may also comprise transporting the substrate 100 from the first single substrate reactor 20 to the buffer chamber 70, storing the substrate 100 temporarily to the buffer chamber 70 and transporting the substrate 100 from the buffer chamber 70 to the second single substrate reactor 30.

In this embodiment, the first single substrate reactor 20 may be plasma process reactor, or alternatively plasma deposition reactor, such as plasma atomic layer deposition reactor. The second single substrate reactor 30 may be gas phase deposition reactor or plasma deposition reactor, such as plasma atomic layer deposition reactor and the first batch process reactor 40 a batch process deposition reactor such as batch process atomic layer deposition reactor or another gas phase deposition reactor.

Figure 16:
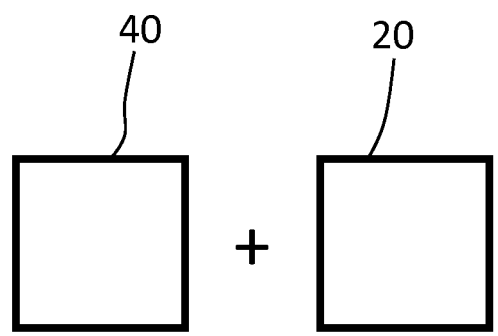
Figure 18:
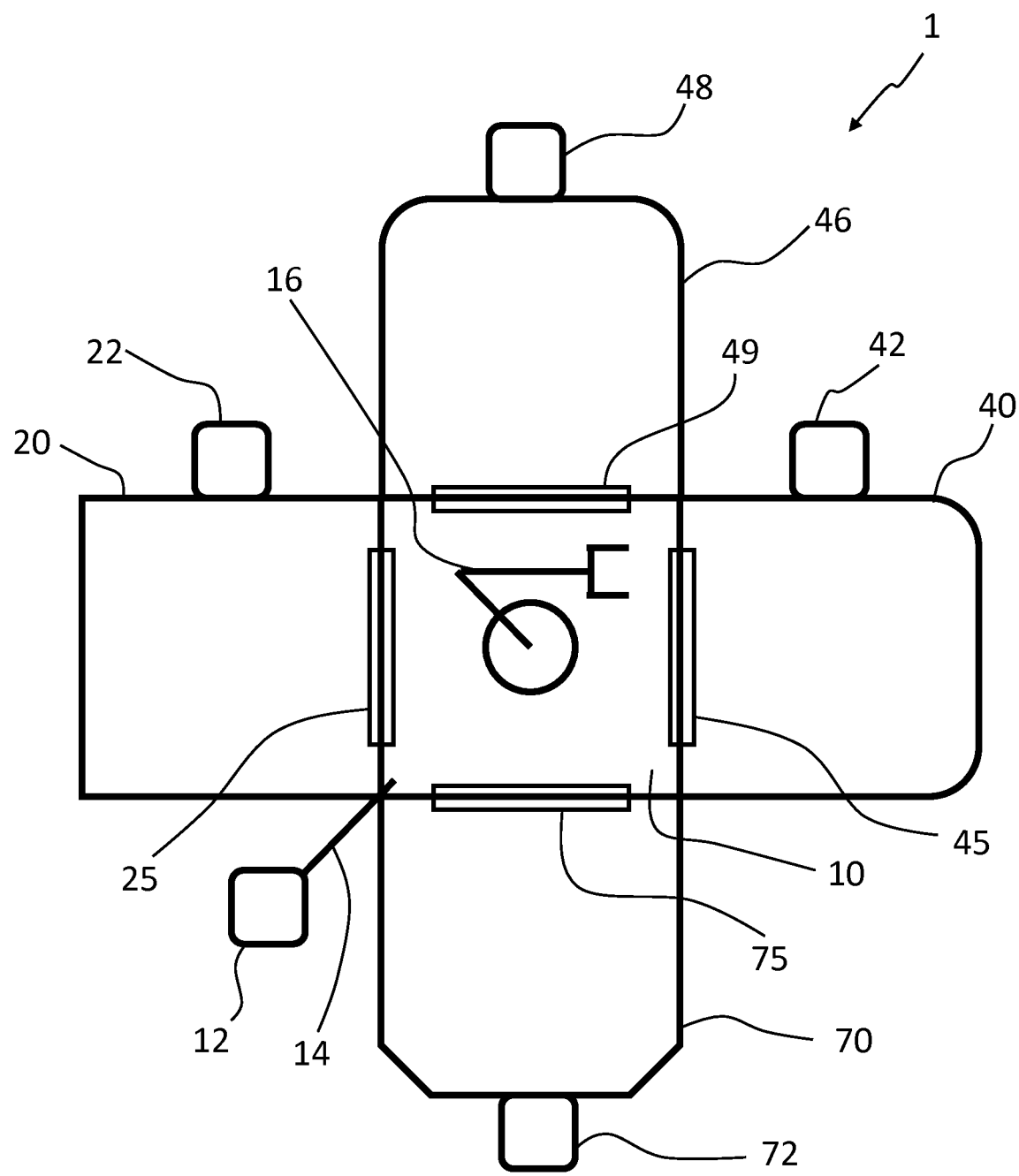
FIG. 18 shows schematically a further embodiment of a cluster apparatus according to the present invention.

FIG. 16 shows schematically utilization of the cluster apparatus 1 of FIG. 9 or FIG. 5 or alternatively FIG. 18 for carrying out the method of the present invention. First, the substrate 100 is processed in the first batch reactor 40, then the substrate is processed in the first single substrate reactor 20.

Figure 17:
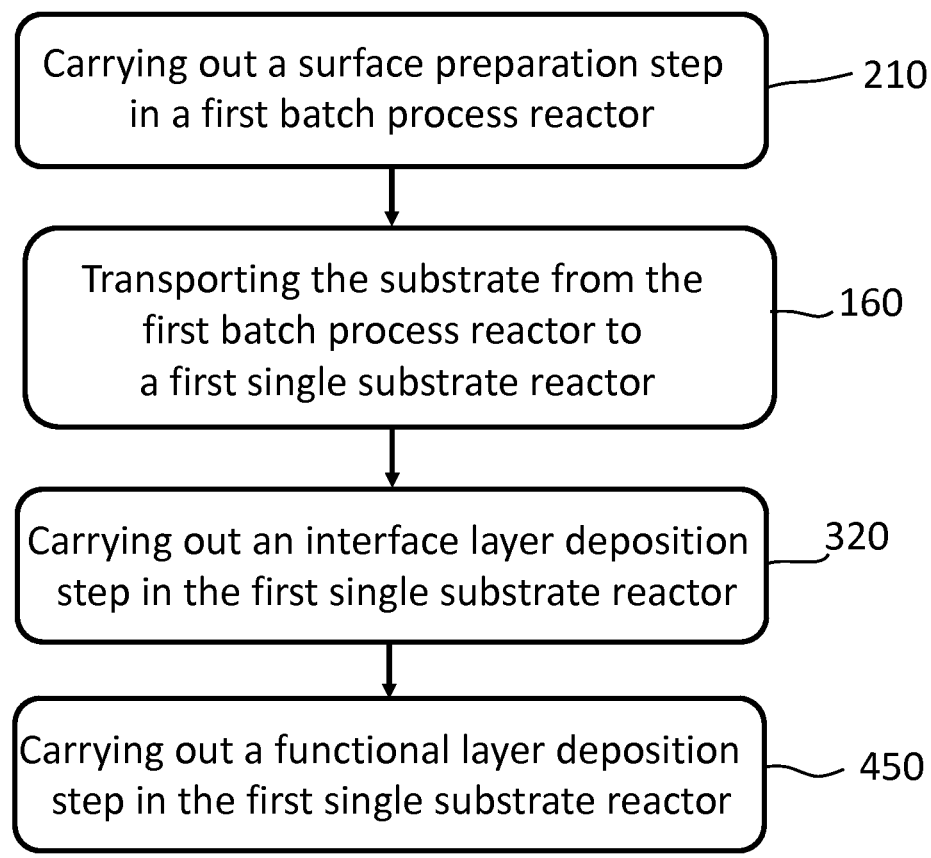

FIG. 17 shows a flow chart of another embodiment of the method to be carried with the cluster apparatus of FIG. 9, 5 or 18.

The method according to FIG. 17 comprises carrying out step a) in the first batch process reactor 40 in 210, transporting the substrate 100 after step a) from the first batch process reactor 40 to the first single substrate reactor 20 via the transport chamber 10 under vacuum atmosphere in 160 and carrying out steps b) and c) in the first single substrate reactor 20 in 320 and 450, respectively.

The transporting 160 of the substrate may also comprise transporting the substrate 100 from the first batch process reactor 40 to the buffer chamber 70, storing the substrate temporarily to the buffer chamber 70 and transporting the substrate 100 from the buffer chamber 70 to the first single substrate reactor 20.

In the embodiment of FIG. 17, a plasma single substrate deposition reactor for steps b) and c) with plasma electrodes. In step c) the plasma electrodes or plasma feature may not be utilized, if desirable. Further, the batch process reactor 40 may be an atomic layer deposition reactor.

FIG. 18 shows a further embodiment of the cluster apparatus 1. The cluster apparatus 1 comprises the transport chamber 10 and the cluster vacuum device 12 connected to the transport chamber 10 for providing vacuum atmosphere inside the transport chamber 10. The transport robot 16 is arranged inside the transport chamber 10.

The cluster apparatus 1 further comprises the first single substrate reactor 20 connected to the transport chamber 10 via the first transport connection 25 via which a substrate is loaded on the first single substrate reactor 20 and unloaded from there, and with which the first single substrate reactor 20 is opened and closed. The first vacuum device 22 is connected to the first single substrate reactor 20 for providing vacuum atmosphere inside the first single substrate reactor 20.

The cluster apparatus 1 comprises the first batch process reactor 40 connected to the transport chamber 10 via the batch transport connection 45 via which a substrate is loaded on the first batch process reactor 40 and unloaded from there, and with which first batch process reactor 40 is opened and closed. The batch transport connection 45 may comprise for example the gate valve. A batch vacuum device 42 is connected to the first batch reactor 40 for providing vacuum atmosphere inside the first batch reactor 40.

The cluster apparatus 1 further comprises a first second process reactor 46 connected to the transport chamber 10 via a second batch transport connection 49 via which a substrate is loaded on the second batch process reactor 46 and unloaded from there, and with which second batch process reactor 46 is opened and closed. The second batch transport connection 49 may comprise for example the gate valve. A second batch vacuum device 48 is connected to the second batch reactor 46 for providing vacuum atmosphere inside the second batch reactor 46.

The cluster apparatus 1 of FIG. 9 further comprises the buffer chamber 70 connected to the transport chamber 10 via the buffer transport connection 75 via which a substrate is loaded on the buffer chamber 70 and unloaded from there, and with which the buffer chamber 70 is open and closed. The buffer vacuum device 72 is connected to the buffer chamber 70 for providing vacuum atmosphere inside the buffer chamber 70.

Accordingly, the cluster apparatus 1 of FIG. 18 comprises two batch process reactors 40, 46 arranged to process two or more substrates at a time. Further, the cluster apparatus comprises one single substrate reactor 20 arranged to process one substrates at the same time.

In this embodiment, the first single substrate reactor 20 is a plasma process reactor or plasma deposition reactor or plasma atomic layer deposition reactor comprising plasma electrodes 84, 86. The step b) of the method is carried out in first single substrate reactor 20.

Figure 19:
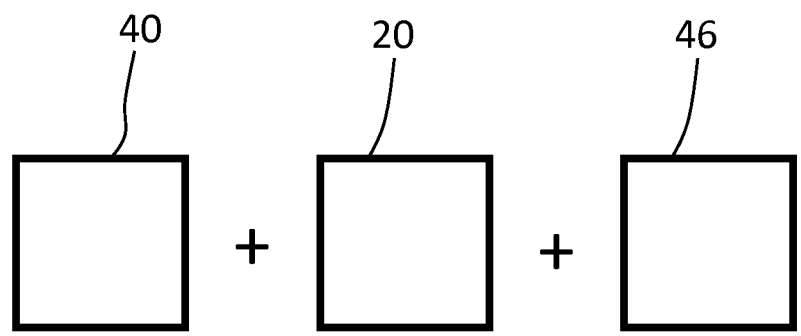
FIGS. 19 to 21 shows flow charts of methods carried out with the cluster apparatus of FIG. 18.

FIG. 19 shows schematically utilization of the cluster apparatus 1 of FIG. 18 for carrying out the method of the present invention. First, the substrate 100 is processed in the first batch reactor 40, then the substrate is processed in the first single substrate reactor 20 and finally the substrate is processed in the second batch process reactor 46.

Figure 20:
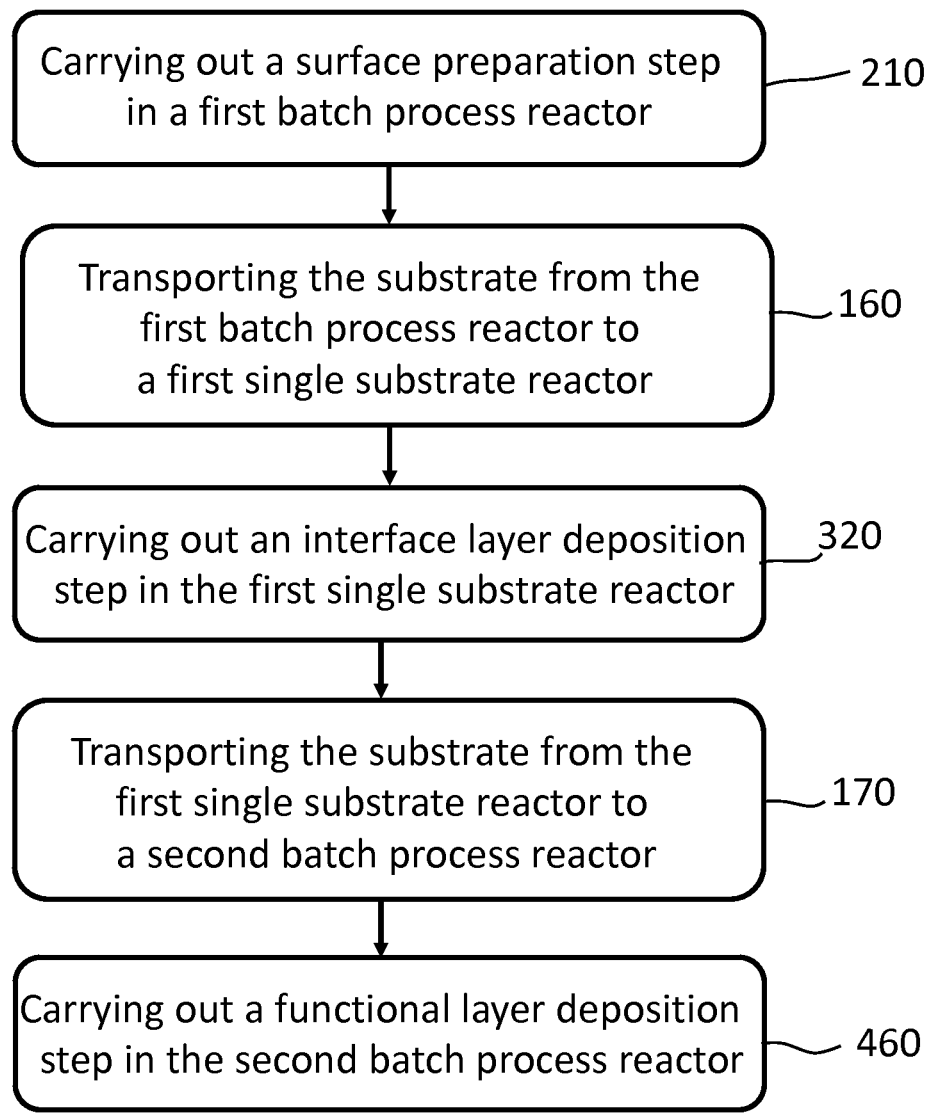

FIG. 20 shows a flow chart of another embodiment of the method to be carried with the cluster apparatus of FIG. 18.

The method according to FIG. 20 comprises carrying out step a) in the first batch process reactor 40 in 210, transporting the substrate 100 after step a) from the first batch process reactor 40 to the first single substrate reactor 20 via the transport chamber 10 under vacuum atmosphere in 160, carrying out step b) in the first single substrate reactor 20 in 320, transporting the substrate 100 after step a) from the first single substrate reactor 20 to the second batch process reactor 46 via the transport chamber 10 under vacuum atmosphere in 170 and carrying out step c) in the second batch process reactor 46 in 460.

The transporting 160 of the substrate may also comprise transporting the substrate 100 from the first batch process reactor 40 to the buffer chamber 70, storing the substrate temporarily to the buffer chamber 70 and transporting the substrate 100 from the buffer chamber 70 to the first single substrate reactor 20.

Furthermore, the transporting 170 of the substrate may also comprise transporting the substrate 100 from the first single substrate reactor 20 to the buffer chamber 70, storing the substrate temporarily to the buffer chamber 70 and transporting the substrate 100 from the buffer chamber 70 to the second batch process reactor 46.

In the embodiment of FIG. 20, a plasma single substrate deposition reactor with plasma electrodes is utilized for step b). In steps a) and c) the first and second batch process reactors 40, 46 may be gas phase deposition reactors, such as an atomic layer deposition reactor.

Figure 21:
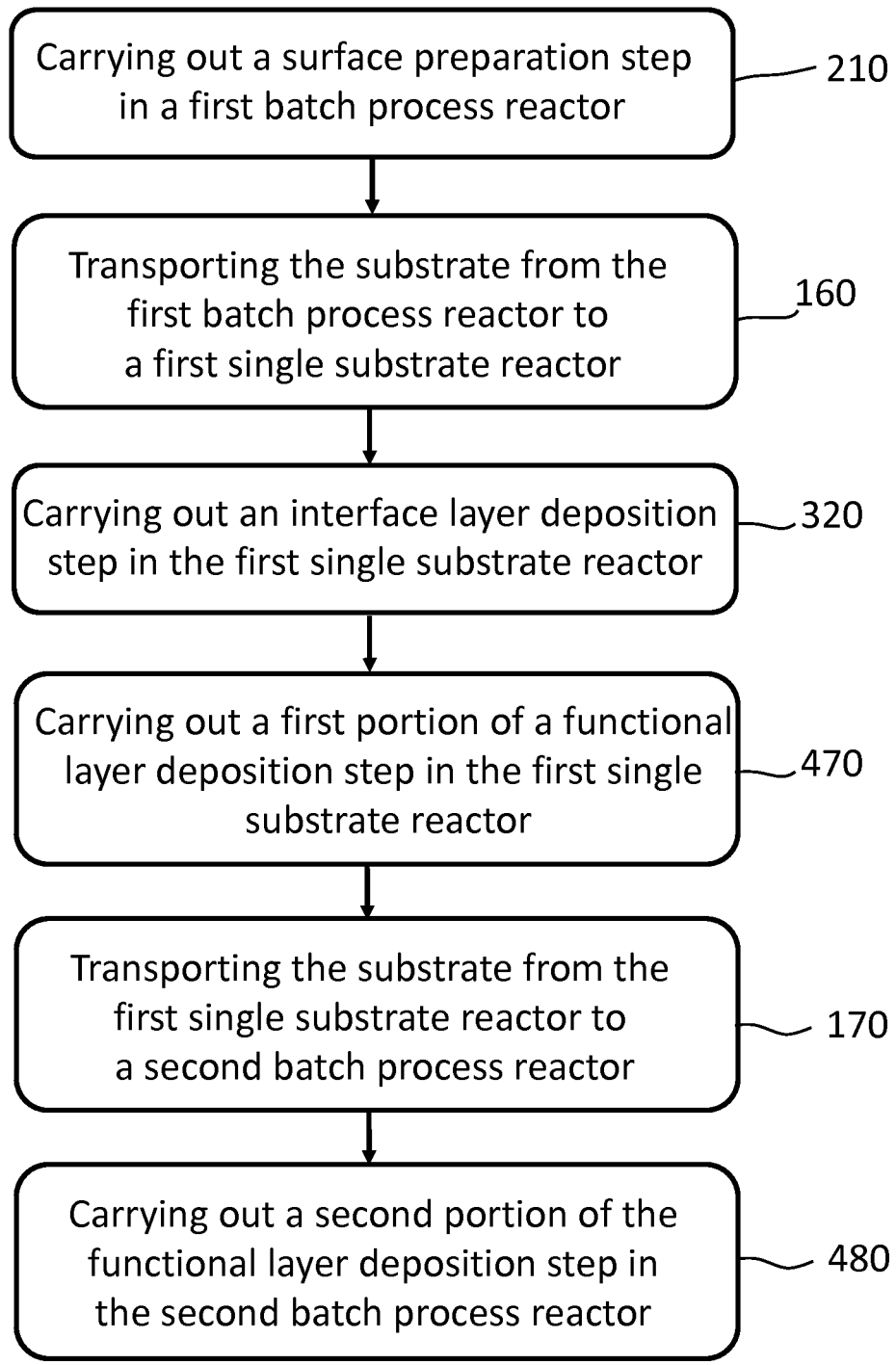

FIG. 21 shows a flow chart of another embodiment of the method to be carried with the cluster apparatus of FIG. 18.

The method according to FIG. 21 comprises carrying out step a) in the first batch process reactor 40 in 210, transporting the substrate 100 after step a) from the first batch process reactor 40 to the first single substrate reactor 20 via the transport chamber 10 under vacuum atmosphere in 160, carrying out step b) in the first single substrate reactor 20 in 320, carrying out the first portion of step c) in the first single substrate reactor 20 in 470, transporting the substrate 100 after step a) and the first portion of step c) from the first single substrate reactor 20 to the second batch process reactor 46 via the transport chamber 10 under vacuum atmosphere in 170 and carrying out the second portion of step c) in the second batch process reactor 46 in 480.

The transporting 160 of the substrate may also comprise transporting the substrate 100 from the first batch process reactor 40 to the buffer chamber 70, storing the substrate temporarily to the buffer chamber 70 and transporting the substrate 100 from the buffer chamber 70 to the first single substrate reactor 20.

Furthermore, the transporting 170 of the substrate may also comprise transporting the substrate 100 from the first single substrate reactor 20 to the buffer chamber 70, storing the substrate temporarily to the buffer chamber 70 and transporting the substrate 100 from the buffer chamber 70 to the second batch process reactor 46.

In the embodiment of FIG. 20, a plasma single substrate deposition reactor with plasma electrodes is utilized for step b). In steps a) and c) the first and second batch process reactors 40, 46 may be gas phase deposition reactors, such as an atomic layer deposition reactor.

The invention has been described above with reference to the examples shown in the figures. However, the invention is in no way restricted to the above examples but may vary within the scope of the claims.

The invention claimed is:

1. A method for processing a surface of a semiconductor substrate, the method being carried out with a cluster apparatus comprising a transport chamber and two or more process reactors connected to the transport chamber, the method comprises providing a vacuum atmosphere to the transport chamber and the method further comprises the following processing steps carried out successively:
    a) subjecting the surface of the semiconductor substrate to a surface preparation step for providing a prepared substrate surface;
    b) providing an interface layer on the prepared substrate surface of the semiconductor substrate for forming an interfaced substrate surface; and
    c) providing a functional layer on the interfaced substrate surface of the semiconductor substrate for providing a functionally coated substrate,
    wherein:
        step a) comprises pre-cleaning the surface of the semiconductor substrate by utilizing plasma treatment on the surface of the semiconductor substrate for providing the prepared substrate surface;
        step b) comprises depositing the interface layer on the prepared substrate surface by utilizing plasma enhanced deposition method for providing the interfaced substrate layer, and depositing an $SiO_2$-layer, or $Si_3N_4$-layer on the prepared substrate surface by utilizing plasma enhanced atomic layer deposition method for providing the interfaced substrate layer; and
        step c) comprises depositing the functional layer on the interfaced substrate surface by utilizing atomic layer deposition method for providing the functionally coated substrate surface, the method further comprises:
    carrying out steps a), b) and c) in at least two different process reactors connected to the transport chamber;
    transporting the semiconductor substrate between the at least two process reactors via the transport chamber under the vacuum atmosphere; and
    carrying out step a) in a first process reactor of the at least two different process reactors;
    transporting the semiconductor substrate after step a) from the first process reactor to a second process reactor of the at least two different process reactors via the transport chamber under vacuum atmosphere; and
    carrying out steps b) and c) in the second process reactor;
    or
    carrying out steps a) and b) in the first process reactor;
    transporting the semiconductor substrate after step b) from the first process reactor to the second process reactor via the transport chamber under vacuum atmosphere; and
    carrying out step c) in the second process reactor;
    or
    carrying out step a) in the first process reactor;
    transporting the semiconductor substrate after step a) from the first process reactor to the second process reactor via the transport chamber under vacuum atmosphere;
    carrying out step b) in the second process reactor;
    transporting the semiconductor substrate after step b) from the second process reactor to a third process reactor of the at least two different process reactors via the transport chamber under vacuum atmosphere; and
    carrying out step c) in the third process reactor.

2. The method according to claim 1, wherein the method comprises:
    carrying out step a) in the first process reactor of the at least two different process reactors;
    transporting the semiconductor substrate after step a) from the first process reactor to the second process reactor of the at least two different process reactors via the transport chamber under the vacuum atmosphere; and
    carrying out steps b) and c) in the second process reactor;
    or
    carrying out steps a) and b) in the first process reactor of the at least two different process reactors;
    transporting the semiconductor substrate after step b) from the first process reactor to the second process reactor of the at least two different process reactors via the transport chamber under the vacuum atmosphere; and
    carrying out step c) in the second process reactor.

3. The method according to claim 1, wherein the method comprises:
    carrying out steps a) and b) in a single substrate reactor and carrying out step c) in a batch process reactor; or
    carrying out step a) in a first single substrate reactor, carrying out step b) in a second single substrate reactor and carrying out step c) in a batch process reactor; or
    carrying out steps a), b) and a first portion of step c) in a single substrate reactor, and carrying out a second portion of step c) in a batch process reactor; or
    carrying out step a) in a first single substrate reactor, carrying out step b) in a second single substrate reactor, carrying out a first portion of step c) in the second single substrate reactor, and carrying out a second portion of step c) in a batch process reactor.

4. The method according to claim 1, wherein the method comprises:
- carrying out step a) in a single substrate reactor;
- transporting the semiconductor substrate after step a) from the first single substrate reactor to a second single substrate reactor via the transport chamber under the vacuum atmosphere; and
- carrying out steps b) and c) in the second single substrate reactor; or
- carrying out steps a) and b) in a first single substrate reactor;
- transporting the semiconductor substrate after step b) from the first single substrate reactor to a second single substrate reactor via the transport chamber under the vacuum atmosphere; and
- carrying out step c) in the second single substrate reactor.

5. The method according to claim 1, wherein the method comprises:
- carrying out steps a) and b) in a first single substrate reactor;
- transporting the semiconductor substrate after step b) from the first single substrate reactor to a first batch process reactor via the transport chamber under the vacuum atmosphere; and
- carrying out steps c) in the first batch process reactor; or
- carrying out steps a) and b) in a first single substrate reactor;
- carrying out a first portion of step c) in the first single substrate reactor for providing the first portion of the functional layer on the interfaced substrate surface;
- transporting the semiconductor substrate after the first portion of step c) from the first single substrate reactor to the first batch process reactor via the transport chamber under the vacuum atmosphere; and
- carrying out a second portion of step c) in a first batch process reactor for providing the second portion of the functional layer on the first portion of the functional layer.

6. The method according to claim 1, wherein the method comprises:
- carrying out step a) in a first single substrate reactor;
- transporting the semiconductor substrate after step a) from the first single substrate reactor to a second single substrate reactor via the transport chamber under the vacuum atmosphere;
- carrying out step b) in the second single substrate reactor;
- transporting the semiconductor substrate after step b) from the second single substrate reactor to a first batch process reactor via the transport chamber under the vacuum atmosphere; and
- carrying out step c) in the first batch process reactor; or
- carrying out step a) in a first single substrate reactor;
- transporting the semiconductor substrate after step a) from the first single substrate reactor to a second single substrate reactor via the transport chamber under the vacuum atmosphere;
- carrying out step b) in the second single substrate reactor;
- carrying out a first portion of step c) in the second single substrate reactor for providing the first portion of the functional layer on the interfaced substrate surface;
- transporting the semiconductor substrate after the first portion of step c) from the second single substrate reactor to the first batch process reactor via the transport chamber under the vacuum atmosphere; and
- carrying out a second portion of step c) in the first batch process reactor.

7. The method according to claim 1, wherein the method comprises:
- carrying out step a) in a first batch process reactor;
- transporting the semiconductor substrate after step a) from the first batch process reactor to a first single substrate reactor via the transport chamber under the vacuum atmosphere; and
- carrying out steps b) and c) in the first single substrate reactor.

8. The method according to claim 1, wherein the method comprises:
- carrying out step a) in a first batch process reactor;
- transporting the semiconductor substrate after step a) from the first batch process reactor to a first single substrate reactor via the transport chamber under the vacuum atmosphere;
- carrying out step b) in the first single substrate reactor;
- transporting the semiconductor substrate after step b) from the first single substrate reactor to a second single substrate reactor via the transport chamber under the vacuum atmosphere; and
- carrying out step c) in the second single substrate reactor; or
- carrying out step a) in a first batch process reactor;
- transporting the semiconductor substrate after step a) from the first batch process reactor to a first single substrate reactor via the transport chamber under the vacuum atmosphere;
- carrying out step b) in the first single substrate reactor;
- carrying out a first portion of step c) in the first single substrate reactor for providing the first portion of the functional layer on the interfaced substrate surface;
- transporting the semiconductor substrate after the first portion of step c) from the first single substrate reactor to a second single substrate reactor via the transport chamber under the vacuum atmosphere; and
- carrying out a second portion of step c) in the second single substrate reactor.

9. The method according to claim 1, wherein the method comprises:
- carrying out step a) in a first batch process reactor;
- transporting the semiconductor substrate after step a) from a first batch process reactor to a first single substrate reactor via the transport chamber under the vacuum atmosphere;
- carrying out step b) in the first single substrate reactor;
- transporting the semiconductor substrate after step b) from the first single substrate reactor to a second batch process reactor via the transport chamber under the vacuum atmosphere; and
- carrying out step c) in the second batch process reactor; or
- carrying out step a) in a first batch process reactor;
- transporting the semiconductor substrate after step a) from the first batch process reactor to a first single substrate reactor via the transport chamber under the vacuum atmosphere;
- carrying out step b) in the first single substrate reactor;
- carrying out a first portion of step c) in the first single substrate reactor for providing the first portion of the functional layer on the interfaced substrate surface;
- transporting the semiconductor substrate after the first portion of step c) from the first single substrate reactor to a second batch process reactor via the transport chamber under the vacuum atmosphere; and
- carrying out a second portion of step c) in the second batch process reactor.

10. The method according to claim 1, wherein:
step a) comprises subjecting the surface of two or more semiconductor substrates simultaneously to the surface preparation step in the first batch process reactor; or
step c) comprises providing the functional layer or the second portion of the functional layer to two or more semiconductor substrates simultaneously in the first batch process reactor or in the second batch process reactor; or
step a) comprises subjecting the surface of two or more semiconductor substrates simultaneously to the surface preparation step in the first batch process reactor; and
step c) comprises providing the functional layer or the second portion of the functional layer to two or more semiconductor substrates simultaneously in the second batch process reactor.

11. The method according to claim 1, wherein step a) comprises:
pre-cleaning the surface of the semiconductor substrate by NH3-plasma processing for providing the prepared substrate surface; or
pre-cleaning the surface of the semiconductor substrate by plasma processing utilizing $N_2$-plasma, $O_2$-plasma, Ar-plasma, $H_2$-plasma, CO-plasma, $CO_2$-plasma or a mixture thereof for providing the prepared substrate surface.

12. The method according to claim 1, wherein step c) comprises:
depositing the functional layer on the interfaced substrate surface by utilizing thermal atomic layer deposition method for providing the functionally coated substrate surface.

13. The method according to claim 1, wherein the method is applied to a semiconductor substrate, compound semiconductor substrate, or group iii-v semiconductor substrate.

14. The method according to claim 1, wherein the method is carried out with the cluster apparatus which further comprises a vacuum device connected to the transport chamber for providing the vacuum atmosphere inside the transport chamber, a transport robot arranged inside the transport chamber, two or more process reactors connected to the transport chamber, the two or more process chambers comprise a first single substrate process reactor arranged to receive one semiconductor substrate, and a first batch process reactor arranged to receive two or more semiconductor substrates, wherein:
the first single substrate reactor is an atomic layer deposition reactor having a reaction chamber and comprises plasma electrodes arranged to generate plasma inside the reaction chamber; and
the first batch reactor is an atomic layer deposition reactor having a reaction chamber and a substrate rack arranged to support two or more semiconductor substrates.

15. The method according to claim 1, wherein carrying out step c) includes providing on the interfaced substrate surface a first portion of the functional layer having a thickness of between 1 nm to 10 nm, and providing on the interfaced substrate surface a second portion of the functional layer having a thickness of at least 5 nm.

16. The method according to claim 1, wherein the pre-cleaning of the surface of the semiconductor substrate is an initial treatment of the surface of the semiconductor substrate.

17. A method for processing a surface of a semiconductor substrate, the method being carried out with a cluster apparatus comprising a transport chamber and two or more process reactors connected to the transport chamber, the method consists of the following processing steps carried out successively:
a) subjecting the surface of the semiconductor substrate to a surface preparation step for providing a prepared substrate surface;
b) providing an interface layer on the prepared substrate surface of the semiconductor substrate for forming an interfaced substrate surface; and
c) providing a functional layer on the interfaced substrate surface of the semiconductor substrate for providing a functionally coated substrate,
wherein:
step a) consists of pre-cleaning the surface of the semiconductor substrate by utilizing plasma treatment on the surface of the semiconductor substrate for providing the prepared substrate surface;
step b) consists of depositing the interface layer on the prepared substrate surface by utilizing plasma enhanced deposition method for providing the interfaced substrate layer, and depositing an AlN-layer or an $Al_2O_3$-layer on the prepared substrate surface by utilizing plasma enhanced atomic layer deposition method for providing the interfaced substrate layer; and
step c) consists of depositing the functional layer on the interfaced substrate surface by utilizing atomic layer deposition method for providing the functionally coated substrate surface,
the method further consists of:
carrying out steps a), b) and c) in at least two different process reactors connected to the transport chamber; and
transporting the semiconductor substrate between the at least two process reactors via the transport chamber under the vacuum atmosphere.

18. A method for processing a surface of a semiconductor substrate, the method being carried out with a cluster apparatus comprising a transport chamber and two or more process reactors connected to the transport chamber, the method consists of the following processing steps carried out successively:
a) subjecting the surface of the semiconductor substrate to a surface preparation step for providing a prepared substrate surface;
b) providing an interface layer on the prepared substrate surface of the semiconductor substrate for forming an interfaced substrate surface; and
c) providing a functional layer on the interfaced substrate surface of the semiconductor substrate for providing a functionally coated substrate,
wherein:
step a) consists of pre-cleaning the surface of the semiconductor substrate by utilizing plasma treatment on the surface of the semiconductor substrate for providing the prepared substrate surface;
step b) consists of depositing the interface layer on the prepared substrate surface by utilizing plasma enhanced deposition method for providing the interfaced substrate layer, and depositing an $SiO_2$-layer, $Si_3N_4$-layer, $ZrO_2$-layer, SiC-layer, or SiCN-layer on the prepared substrate surface by utilizing plasma enhanced atomic layer deposition method for providing the interfaced substrate layer; and
step c) consists of depositing the functional layer on the interfaced substrate surface by utilizing atomic layer deposition method for providing the functionally coated substrate surface, the method further consists of:
- carrying out steps a), b) and c) are carried out in at least three different process reactors connected to the transport chamber;
- transporting the semiconductor substrate between the at least three process reactors via the transport chamber under the vacuum atmosphere;
- carrying out step a) in a first process reactor of the at least three different process reactors;
- transporting the semiconductor substrate after step a) from the first process reactor to a second process reactor of the at least three different process reactors via the transport chamber under vacuum atmosphere;
- carrying out step b) in the second process reactor;
- transporting the semiconductor substrate after step b) from the second process reactor to a third process reactor of the at least three different process reactors via the transport chamber under vacuum atmosphere; and
- carrying out step c) in the third process reactor.

19. The method according to claim 18, wherein the pre-cleaning of the surface of the semiconductor substrate is an initial treatment of the surface of the semiconductor substrate.

\* \* \* \* \*